United States Patent
Smeeton et al.

(10) Patent No.: US 9,405,169 B2
(45) Date of Patent: Aug. 2, 2016

(54) FREQUENCY-CONVERTED LIGHT SOURCE

(71) Applicant: Sharp Kabushiki Kaisha, Osaka (JP)

(72) Inventors: Tim Michael Smeeton, Oxford (GB); Edward Andrew Boardman, Abingdon (GB); Karl Peter Welna, Abingdon (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/056,257

(22) Filed: Feb. 29, 2016

(65) Prior Publication Data

US 2016/0178986 A1      Jun. 23, 2016

Related U.S. Application Data

(62) Division of application No. 14/136,202, filed on Dec. 20, 2013, now Pat. No. 9,310,664.

(51) Int. Cl.
*G02F 1/37* (2006.01)
*H01S 5/00* (2006.01)
*H01S 5/323* (2006.01)
(Continued)

(52) U.S. Cl.
CPC .............. *G02F 1/37* (2013.01); *G02F 1/3501* (2013.01); *G02F 1/3551* (2013.01); *H01S 5/0092* (2013.01); *H01S 5/32341* (2013.01); *G02F 2001/3503* (2013.01)

(58) Field of Classification Search
CPC ..................................... G02F 1/35; G02F 1/37
USPC ................................ 359/326–332; 372/21–22
See application file for complete search history.

(56) References Cited

U.S. PATENT DOCUMENTS

| 5,355,246 A | 10/1994 | Tanuma |
| 5,506,860 A | 4/1996 | Hyuga et al. |
| 5,592,326 A | 1/1997 | Taira |

(Continued)

FOREIGN PATENT DOCUMENTS

| DE | 10 2007 063 492 B4 | 4/2010 |
| JP | 2000-305118 A | 11/2000 |

OTHER PUBLICATIONS

Blume et al., "Rayleigh length dependent SHG conversion at 488nm using a monolithic DBR tapered diode laser", Proc. of SPIE vol. 6875, 68751C, 2008.

(Continued)

*Primary Examiner* — Daniel Petkovsek
(74) *Attorney, Agent, or Firm* — Renner, Otto, Boisselle & Sklar, LLP

(57) ABSTRACT

A light source includes a light emitting element configured to emit a non-diffraction limited input light beam, a nonlinear frequency conversion (NLFC) component that exhibits walkoff and performs second harmonic generation whereby at least a portion of an output beam outputted by the NLFC component has twice a frequency of the input beam, and an optical component positioned to receive the input light beam and configured to converge the non-diffraction limited input beam into the NLFC component. The light emitting element emits the input light beam having a beam quality factor in at least one plane of the input beam that is greater than 2 ($M^2 > 2$). Furthermore, the light emitting element is a laser diode including $Al_y In_x Ga_{1-x-y} N$ ($0 \le x \le 1$, $0 \le y \le 1$) semiconductor materials, and one dimension of an emission region of the laser diode is at least 5 µm.

11 Claims, 6 Drawing Sheets

(51) Int. Cl.
*G02F 1/355* (2006.01)
*G02F 1/35* (2006.01)

(56) References Cited

U.S. PATENT DOCUMENTS

| | | | |
|---|---|---|---|
| 5,963,359 | A | 10/1999 | Shinozaki et al. |
| 6,141,369 | A | 10/2000 | Seelert et al. |
| 6,744,552 | B2 | 6/2004 | Scalora et al. |
| 7,110,426 | B2 | 9/2006 | Masuda |
| 7,113,325 | B1 | 9/2006 | Moulton et al. |
| 7,403,677 | B1 * | 7/2008 | Zhao ............ G02B 6/32 359/245 |
| 8,125,703 | B2 | 2/2012 | Kusukame et al. |
| 8,625,189 | B2 | 1/2014 | Gawith et al. |
| 8,873,596 | B2 | 10/2014 | Dribinski et al. |
| 9,310,664 | B2 * | 4/2016 | Smeeton ............ F21K 9/56 |
| 2009/0103576 | A1 | 4/2009 | Achtenhagen |
| 2010/0278200 | A1 | 11/2010 | Dicks et al. |

OTHER PUBLICATIONS

Freegarde et al., "General analysis of type I second-harmonic generation with elliptical Gaussian beams", J. Opt. Soc. Am. B/vol. 14, No. 8, Aug. 1997.

"Lasers and laser-related equipment—Test methods for laser beam widths, divergence angles and beam propagation ratios—Part 1: Stigmatic and simple astigmatic beams", ISO Ref. No. 11146-1, Jan. 15, 2005.

Boyd et al., "Parametric Interaction of Focused Gaussian Light Beams", Journal of Applied Physics, vol. 39, No. 8, Jul. 1968.

Nishimura et al., "A Compact 209-nm Deep UV cw Light Source for Spectroscopy Using Frequency Doubling of a Diode Laser", Japanese Journal of Applied Physics, vol. 42, No. 8, pp. 5079-5081, Aug. 2003.

Tangtrongbenchasil et al., "Tunable 220 nm UV-C Generation Based on Second Harmonic Generation Using Tunable Blue Laser Diode System", Japanese Journal of Applied Physics, vol. 47, No. 4, pp. 2137-2140, 2008.

Ciapponi Alessandra et al: "Non-linear optical frequency conversion crystals for space applications", Solid State Lasers XX: Technology and Devices, SPIE, 1000 20th St. Bellingham WA 98225-6705 USA, vol. 7912, No. 1, Feb. 10, 2011,pp. 1-13, XP060006799, DOI: 10.1117/12.878587 [retrieved on Feb. 4, 2011].

Extended European Search Report for corresponding European Patent Application No. 14004264.9 dated May 12, 2015.

Steinbach A. et al.: "CW second harmonic generation with elliptical Gaussian beams", Optics Communications, North-Holland Publishing Co. Amsterdam, NL, vol. 123, No. 1, Jan. 15, 1996, pp. 207-214.

Keller T. et al.: "Efficient Laser Performance of Nd:YAG at 946 NM and intracavity Frequency Doubling with LiJO3, Beta-BaB2O4, and LiB3O5", Applied Physic B: Laser and Optics, Springer International, Berlin, DE, vol. B65, No. 6, Dec. 1, 1997, pp. 789-792.

Antonio Agnesi et al.: "Efficient Wavelength Conversion with High-Power Passively Q-Switched Diode-Pumped Neodymium Lasers", IEEE Journal of Quantum Electronics, IEEE Service Center, Piscataway, NJ, USA, vol. 34, No. 8, Aug. 1, 1998.

Multimode nonlinear optics, CLEO'98, May 1998, CThP6, 435.

Japanese Office Action for corresponding Japanese application No. 2014-254475 dated Nov. 10, 2015.

Non-Final Office Action for related U.S. Appl. No. 14/136,202, dated Mar. 3, 2015.

Non-Final Office Action for related U.S. Appl. No. 14/136,202, dated Sep. 3, 2015.

Final Office Action for related U.S. Appl. No. 14/136,202, dated Oct. 21, 2015.

* cited by examiner

Fig. 7

| λ₁ / nm | θ /° |
|---|---|
| 410 | 87.0 |
| 415 | 79.7 |
| 420 | 75.9 |
| 425 | 73.0 |
| 430 | 70.5 |
| 435 | 68.4 |
| 440 | 66.5 |
| 445 | 64.9 |
| 450 | 63.3 |
| 455 | 61.9 |
| 460 | 60.6 |
| 465 | 59.3 |
| 470 | 58.1 |
| 475 | 57.1 |
| 480 | 56.0 |
| 485 | 55.0 |
| 490 | 54.1 |
| 495 | 53.2 |
| 500 | 52.3 |
| 505 | 51.5 |
| 510 | 50.7 |
| 515 | 50.0 |
| 520 | 49.3 |
| 525 | 48.6 |
| 530 | 47.9 |
| 535 | 47.2 |
| 540 | 46.6 |
| 545 | 46.0 |
| 550 | 45.4 |
| 555 | 44.9 |
| 560 | 44.3 |
| 565 | 43.8 |
| 570 | 43.3 |
| 575 | 42.8 |
| 580 | 42.3 |
| 585 | 41.8 |
| 590 | 41.3 |
| 595 | 40.9 |
| 600 | 40.5 |

FREQUENCY-CONVERTED LIGHT SOURCE

CROSS-REFERENCE TO RELATED APPLICATION

The present application is a Divisional application of Ser. No. 14/136,202 filed on Dec. 20, 2013.

TECHNICAL FIELD

The present invention relates to a light emitting device which includes a frequency-conversion process. The invention relates to the design of said device.

BACKGROUND ART

There are many examples in the prior art of photonic devices which exploit nonlinear optical properties of materials to convert input light with at least one frequency into generated light with at least one frequency different from the input frequency or frequencies. In one type of device, light of a first frequency ($f_1$) passes through a material with a non-zero second order nonlinear susceptibility, and some or all of the input light is converted into generated light with a second frequency ($f_2$), where $f_2=2f_1$. This process is commonly referred to as "second harmonic generation" (SHG) and sometimes as "frequency doubling". In another type of device, input light including light with two different frequencies passes through a material with a non-zero second order nonlinear susceptibility, and some or all of the input light may be converted into generated light with a third frequency. This process is commonly referred to as sum frequency generation (SFG) or difference frequency generation (DFG). SHG, SFG and DFG are all examples of nonlinear frequency conversion (NLFC) processes.

A wide range of materials with large second order nonlinear susceptibilities are known to exist. Examples include lithium niobate ($LiNbO_3$), potassium titanyl phosphate ($KTiOPO_4$), lithium triborate ($LiB_3O_5$), β-barium borate (β-$BaB_2O_4$) and potassium dihydrogen phosphate ($KH_2PO_4$), among many others. A component which can exhibit NLFC can be fabricated from these materials and is referred to here as an NLFC component.

In photonic devices which use NLFC components, it is often important that the NLFC process occurs with high efficiency. The efficiency of NLFC is the ratio of a power of generated light divided by a power of the input light. In the case of SHG the efficiency of SHG is the ratio of the power of frequency-doubled light divided by the power of the input light.

The efficiency of NLFC can depend strongly on the properties of the input beam of light as it passes through an NLFC component. In many examples of NLFC the input beam is focussed in at least one plane of the beam (a plane of the beam is any plane within which the propagation direction of the beam lies). This is illustrated in FIG. 1 which is an illustration of a focussed input beam 1 passing through an NLFC component 2, where the plane of the diagram is a plane of the beam in which the beam is focussed. As the focussed input beam 1 propagates through the NLFC component 2, the beam width 3 first decreases, then reaches a minimum value and then increases. The beam width 3 in a given plane of the beam is the width along a direction which lies in said plane and is perpendicular to the propagation direction 4 of the beam. The beam radius is defined as equal to one half of the beam width. The position along the propagation direction of the beam at which the beam width in a plane of the beam is a minimum is described as a beam waist in said plane of the beam, and the beam radius in said plane at this position is described as the beam waist radius 5 in said plane. In general a light beam may not have circular symmetry about its propagation direction. In this case, at any position along the propagation direction of the beam, the beam width measured in two different planes of the beam may not be equal.

The input beam may be focussed, for example, using one or more lenses, so that the beam converges in at least one plane of the beam as it propagates towards the NLFC component (that is, the width of the beam in at least one plane of the beam decreases as the beam propagates towards the NFLC component) such that a beam waist in at least one plane of the beam forms in an NLFC component. In this case, the strength of focussing of the input beam, in a given plane of the beam, can be quantified by the convergence half-angle of the light beam as measured in air before the light beam enters the NLFC component. This is also illustrated in FIG. 1. The convergence half-angle of the beam, $\phi_c$, is defined as $\tan(\phi_c)=\frac{1}{2}\{w(z_1)-w(z_2)\}/\{z_2-z_1\}$, where $w(z_1)$ and $w(z_2)$ are widths of the beam measured at two positions along the propagation direction 4 of the beam, $z_1$ and $z_2$, both located before the beam propagates into the NLFC component 2.

The strength of focussing of an input light beam, in a given plane of the beam, can also be quantified by the divergence half-angle of the light beam as measured in air after the beam has exited from the NLFC component. The divergence half-angle of the beam, $\phi_d$, is defined as $\tan(\phi_d)=\frac{1}{2}\{w(z_4)-w(z_3)\}/\{z_4-z_3\}$, where $w(z_3)$ and $w(z_4)$ are the widths of the beam measured at two positions along the propagation direction 4 of the beam, $z_3$ and $z_4$, both located after the beam propagates out of the NLFC component 2.

The efficiency of NLFC can depend strongly on the widths of the input beam as it propagates through the NLFC component. Boyd and Kleinman [Journal of Applied Physics 39, 3597 (1968)] describes a method to identify suitable widths for the input beam within the NLFC component to obtain SHG with high efficiency for the special case of an input beam which has the form of a circular "Gaussian beam" inside the NLFC component. A Gaussian beam is a beam of light in which the intensity of the light varies in a Gaussian way with radial distance from its centre. The width of a Gaussian beam at a position along the propagation direction of the beam is commonly defined as the distance, measured along a direction which is perpendicular to the propagation direction of the beam, between the two points at which the intensity of the beam is equal to $1/e^2$ of the maximum intensity of the beam at that position along the propagation direction of the beam. A circular Gaussian beam has an equal beam width in all planes of the beam, at a particular position along the propagation direction of the beam. For a Gaussian beam with wavelength λ (measured in a vacuum), propagating in a medium with refractive index n, the beam waist radius $r_w$ and the far-field convergence or divergence half-angle $\phi$ are related by equation 1.

$$r_w \phi = \frac{\lambda}{n\pi} \quad \text{Equation 1}$$

The beam radius, r, varies according to equation 2 where z is a distance from the position of the beam waist, measured along the propagation direction of the beam.

$$r(z) = r_w \sqrt{1 + \left(\frac{\lambda z}{n\pi r_w^2}\right)^2} \qquad \text{Equation 2}$$

The method described by Boyd and Kleinman applies to NLFC in NLFC components which may exhibit "walkoff" of either the input beam or the generated beam. Walkoff can occur due to an optical birefringence of the material in the NLFC component. For the specific case of SHG, if the generated beam exhibits walkoff then the propagation direction of the generated beam in the NLFC component is not the same as the propagation direction of the input beam in the NLFC component. The walkoff angle, ρ, is defined as the angle between the propagation directions of the input beam and the generated beam. The plane containing both the input beam propagation direction and the generated beam propagation direction is referred to as the walkoff plane. The walkoff angle, ρ, can be measured experimentally. Alternatively, the walkoff angle, ρ, can be calculated using standard methods, from knowledge of the propagation direction of a beam, the orientation of the polarisation of the beam and the refractive indices of the material in the NLFC component.

For the special case of a circular Gaussian beam, the method described by Boyd and Kleinman can be applied to determine the suitable beam waist radius for the input beam inside an NLFC component to obtain high SHG efficiency. The suitable beam waist radius depends on the wavelengths of the input and generated light, the refractive indices of the NLFC component to the input and generated light, the walkoff angle and the length of the NLFC component. The refractive indices of the NLFC to the input and generated light and the walkoff angle may depend on the propagation direction of the input light within the NLFC component, relative to the optical axis, or optical axes, of the NLFC component. The convergence half-angle in air of the input beam which will provide approximately said beam waist radius within the NLFC component can then be identified using standard calculation methods for Gaussian beam optics such as using ray transfer matrices, which are sometimes referred to as "ABCD matrices".

Freegarde et al. [Journal of the Optical Society of America B 14, 2010 (1997)] describes a method to identify suitable widths for the input light beam within the NLFC component to obtain SHG with high efficiency for the special case of an input light beam which has the form of an elliptical Gaussian beam. An elliptical Gaussian beam is a beam of light in which the intensity of the light varies in a Gaussian way with distance from the propagation axis along two directions which are perpendicular to each other and perpendicular to the propagation direction of the beam.

The method described by Freegarde et al. applies to NLFC in NLFC components which may exhibit walkoff of either the input beam or the generated beam. For the special case of an elliptical Gaussian beam, the method described by Freegarde et al. can be applied to determine the suitable beam waist radii, defined along two perpendicular principal axes of the Gaussian beam for the input beam inside the NLFC component to obtain high SHG efficiency.

The methods described by Boyd and Kleinman and by Freegarde et al. apply to "ideal" Gaussian beams. Sometimes these ideal Gaussian beams are referred to as "diffraction-limited" beams. In most devices which use SHG the input beam is an ideal Gaussian beam or is closely approximated by a Gaussian beam. In these cases the strength of focussing of input light identified by the methods described by Boyd and Kleinman or by Freegarde et al. as being suitable to obtain SHG with high efficiency are appropriate.

Some beams of light are not closely approximated by a Gaussian beam. These non-Gaussian beams are sometimes described as "non-diffraction-limited". The beam quality factor, $M^2$, can be used to describe the properties of non-diffraction-limited beams. For a non-diffraction-limited beams with wavelength λ (measured in a vacuum), propagating in a medium with refractive index n, the beam waist radius $r_w$ in a plane of the beam and the far-field convergence or divergence angle φ in the same plane of the beam are related by equation 3.

$$r_w \phi = \frac{M^2 \lambda}{n\pi} \qquad \text{Equation 3}$$

The beam radius in the plane of the beam, r, varies according to equation 4, where z is a distance from the position of the beam waist in that plane of the beam, measured along the direction of propagation of the beam.

$$r(z) = r_w \sqrt{1 + \left(\frac{M^2 \lambda z}{n\pi r_w^2}\right)^2} \qquad \text{Equation 4}$$

A non-diffraction-limited beam may be described as an elliptical beam. In this description, two planes of the beam which are perpendicular to one another are defined as principal planes of the beam. The beam quality factor, beam waist radius and the position of the beam waist measured along the propagation direction of the beam, may be different in the two principal planes of the beam.

A light beam with larger beam quality factors is generally considered to be further from diffraction-limited (i.e. "lower quality") than a light beam with smaller beam quality factors. A light beam with $M^2 = 1$ behaves as a diffraction-limited Gaussian beam; a light beam with $M^2 > 1$ is a non-diffraction-limited beam.

The width of a non-diffraction-limited beam may be determined using the so called d4σ (d 4 sigma) method, as described in ISO11146 (2005). The radius of a non-diffraction-limited beam is equal to one half of the width determined by the d4σ method. The beam quality factor in a plane of a given light beam may be determined by measuring the beam radius in said plane at several positions along the direction of propagation of the beam and identifying the $M^2$ value which yields the best fit to equation 4. Procedures for accurate determination of the beam quality factor are described in ISO11146 (2005).

In German patent application DE102007063492B4 (published Apr. 15, 2010), a device for frequency-doubling a non-diffraction-limited beam is described. In this device the "focussing convergence" of the input beam is scaled down from the value that would be found using the method described by Boyd and Kleinman and would apply to a diffraction-limited beam. In particular, the formula shown in equation 5 is described.

$$\theta_{opt} = \frac{\theta_{kohBK}}{1 + (M^2 - 1)Z} \qquad \text{Equation 5}$$

In equation 5, $\theta_{opt}$ is the convergence half-angle of the input beam in the frequency-doubling component which is suitable for the non-diffraction-limited beam with beam quality factor $M^2$, $\theta_{koh\ BK}$ is the convergence half-angle in the frequency-doubling component which is suitable for a diffraction-limited beam and is determined using the method described by Boyd and Kleinman, and Z is a parameter taking a value between 0.2 and 5. In equation 5 we have used the symbols used in the original reference and these are not necessarily consistent with symbols used in the remainder of this application.

It can be seen from the form of equation 5 that the suitable convergence half-angle for a beam with a large beam quality factor ($M^2$) will be significantly smaller than the convergence half-angle which is suitable for a diffraction-limited beam, as determined using the method described by Boyd and Kleinman.

Blume et al. [Proceedings of SPIE 6875 68751C (2008)] describes an alternative device for frequency-doubling a non-diffraction-limited beam. In this device it was shown by experiment that the most suitable conditions for frequency-doubling of a non-diffraction-limited input beam corresponds to focussing of the input beam so that the beam waist radius formed in the frequency-doubling component is approximately $M^2$ times larger than the beam waist radius which would be found to be suitable for a diffraction-limited input beam using the method described by Boyd and Kleinman. By rearranging equations 1 and 3 it is clear that this is equivalent to the condition that the most suitable convergence half-angle for a non-diffraction-limited input beam, measured in the frequency-doubling component, is equal to the most suitable convergence half-angle for a diffraction-limited input beam, measured in the frequency-doubling component, as found using the method described by Boyd and Kleinman.

One application of NLFC is to generate light with wavelengths which are difficult or impossible to generate by other methods. One important example is to generate ultraviolet light using SHG. Ultraviolet light has a wavelength shorter than 400 nm.

Nishimura et al. [Japanese Journal of Applied Physics 42 5079 (2003)] describes a system to frequency-double an input beam with wavelength 418 nm, emitted from a laser diode, to obtain a generated beam with wavelength 209 nm, using a β-BaB$_2$O$_4$ crystal as the NLFC component. The system uses a bulky and complex optical resonator structure but the power of the generated beam is limited to a low value of 0.009 mW. A beam waist radius in the NLFC component was chosen to match the value shown to be suitable by the method described by Boyd and Kleinman, as appropriate for a circular Gaussian beam. For this specific system, the input beam waist radius was approximately 16 µm. Using standard calculation methods for Gaussian beam optics, such as using ray transfer matrices, one can show that this corresponds to a convergence half-angle in air of 0.48°.

A similar optical resonator design is disclosed in Mauda, U.S. Pat. No. 7,110,426 (issued Sep. 19, 2006) to generate ultraviolet light. A suitable beam waist radius was determined using the method described by Boyd and Kleinman.

Tangtronbenchasil et al. [Japanese Journal of Applied Physics 47 2137 (2008)] describes a system to frequency-double a laser beam with wavelength approximately 440 nm, emitted from a laser diode, to obtain a generated beam with wavelength approximately 220 nm, using a β-BaB$_2$O$_4$ crystal as the NLFC component. The power of the generated beam was limited to a low value of approximately 0.0002 mW. For this system the beam waist radius in the NLFC component was chosen to match the value shown to be suitable by the method described by Boyd and Kleinman, as appropriate for circular Gaussian beam.

SUMMARY OF INVENTION

There are examples in the prior art of devices which perform NLFC of input beams in NLFC components which exhibit walkoff. In these examples, the input beam is a Gaussian beam, or may be well approximated as a Gaussian beam, and the methods described by Boyd and Kleinman or by Freegarde et al. may be used to identify suitable strength of focussing of the input light to obtain NLFC with high efficiency. There are also examples in the prior art of devices which include NLFC of non-diffraction limited input beams (i.e. beams characterised by $M^2>1$ in at least one plane of the beam) in NLFC components which do not exhibit walkoff. In these examples the methods described by Blume et al. or in German patent application DE102007063492B4 may be used to identify suitable strength of focussing of the input light to obtain NLFC with high efficiency.

The conventional devices described in the prior art do not perform NLFC of non-diffraction-limited input beams (i.e. beams characterised by $M^2>1$ in at least one plane of the beam) in NLFC components which exhibit walkoff. Furthermore, there are no methods described in the prior art which may be used to identify suitable strength of focussing of the input beam to obtain NLFC with high efficiency for non-diffraction-limited input beams in NLFC components which exhibit walkoff.

An aspect of the present invention is a light source which includes an NLFC component which exhibits walkoff, wherein the input beam for the NLFC process is a non-diffraction-limited beam. In exemplary embodiments of the invention the beam quality factor of the input beam has a value of at least two in at least one plane of the beam. In further exemplary embodiments of the invention the beam quality factor of the input beam has a value of at least two in the plane of the beam which is parallel to the non-walkoff plane of the NLFC component.

In an exemplary embodiment of the invention the input beam has a convergence half-angle in air in the plane of the beam which is approximately parallel to the non-walkoff plane of the NLFC component, which is larger than the convergence half-angle in air of the beam in said plane of the beam which would be suitable for an input beam which is diffraction limited light.

In a further exemplary embodiment of the invention the input beam has a convergence half-angle in air in the plane of the beam which is approximately parallel to the non-walkoff plane of the NLFC component which is equal to $\epsilon \times M_y$ multiplied by the convergence half-angle in air in said plane of the beam which would be suitable for an input beam which is diffraction limited light, where $M_y^2$ is the beam quality factor of the input beam in said plane of the beam, such that $M_y$ is the square root of the beam quality factor, and $\epsilon$ has a value between a lower value equal to the larger of 0.4 and $$\frac{1}{M_y}$$

and an upper value of 5.

In a further exemplary embodiment of the invention the input beam has a convergence half-angle in air in the plane of the beam which is approximately parallel to the non-walkoff plane of the NLFC component which is approximately equal to $M_y$ multiplied by the convergence half-angle in air in said plane of the beam which would be suitable for an input beam which is diffraction limited light, where $M_y^2$ is the beam quality factor of the input beam in said plane of the beam, such that $M_y$ is the square root of the beam quality factor.

A further aspect of the invention is a light source including an NLFC component which exhibits walkoff, wherein the input beam for the NLFC process is non-diffraction limited light and said input beam is generated by a laser diode. In an exemplary embodiment of the invention the laser diode emits light with a wavelength between 400 nm and 600 nm where the laser diode includes $Al_yIn_xGa_{1-x-y}N$ materials. In a further exemplary embodiment of the invention the NLFC process is SHG, the NLFC component includes a $\beta$-$BaB_2O_4$ crystal, and the generated beam has a wavelength between 200 nm and 300 nm, corresponding to deep ultraviolet light. In a further exemplary embodiment of the invention, the input beam is generated by a laser diode, the input beam has a wavelength of between 410 nm and 480 nm, the generated beam has a wavelength between 205 nm and 240 nm, and the NLFC component includes a $\beta$-$BaB_2O_4$ crystal which is approximately 7 mm long (measured parallel to the propagation direction of the input beam) and is oriented for type 1 SHG of the input beam, and the convergence half-angle in air of the input beam in the plane of the beam which is approximately parallel to the non-walkoff plane of the NLFC component is larger than 0.86°, preferably in the range between 0.86° and 10.53°, and most preferably approximately 2.11°.

In a further exemplary embodiment of the invention the laser diode used to generate the source beam has an emission region where at least one dimension of the emission region is at least 5 µm.

In a further exemplary embodiment of the invention the beam quality factor of the input beam in the plane of the beam which is approximately parallel to the walkoff plane of the NLFC component ($M_x^2$) is smaller than the beam quality factor of the input beam in the plane of the beam which is parallel to the non-walkoff plane of the NLFC component ($M_y^2$). In a further aspect of the invention, a polarisation-altering element is used to provide an input beam for an NLFC process with $M_x^2 < M_y^2$.

The present invention provides advantages over the examples in the prior art. In particular, a light source according to the present invention provides a generated beam with much higher power than devices in the prior art. The first use of non-diffraction limited input beams for NLFC in NLFC components which exhibit walkoff can enable use of significantly higher power input beams. For the first time a structure is provided for high-efficiency NLFC, for example SHG, of non-diffraction limited input beams in NLFC components which exhibit walkoff. Several advantages of the present invention have been demonstrated experimentally as described in the detailed description of the invention.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features:

FIG. 7 is a table showing suitable values for θ for Type 1 phase matching in a $\beta$-$BaB_2O_4$ crystal for different input wavelengths $\lambda_1$ (input wavelength is measured in air)

Figure 1:
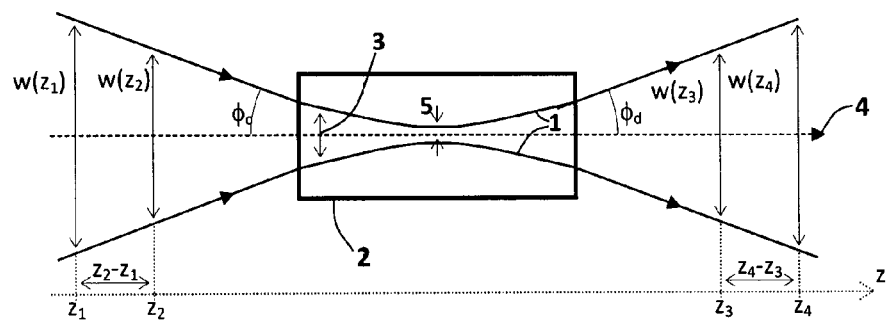
FIG. 1 is an illustration of a focussed input beam passing through an NLFC component.

DESCRIPTION OF REFERENCE NUMERALS 1. input beam
2. NLFC component
3. beam width
4. propagation direction of the beam
5. beam waist radius
10. input beam
11. first plane of the input beam
12. second plane of the input beam
13. NLFC component
14. first surface of the NLFC component
15. propagation direction of the input beam
20. light source
21. laser diode
22. aspheric lens
23. dichroic component
24. first cylindrical lens
25. second cylindrical lens
26. NLFC component
27. first filter
28. spherical lens
29. second filter
30. divergent beam emitted by the laser diode
31. beam with low divergence in at least one plane of the beam 32. source beam
33. input beam
34. generated beam
35. first surface of the NLFC component
36. second surface of the NLFC component
37. emitted light
50. emission surface of a laser diode
51. output light
52. light emitting material
53. emission region
60. dichroic mirror
61. reflected generated beam
62. transmitted input beam
63. lens
64. filter
65. lens
70. polarisation-altering element

DETAILED DESCRIPTION OF INVENTION

The device in accordance with the present invention is a light source which performs NLFC of a non-diffraction-limited input beam. The NLFC process occurs in a NLFC component which exhibits walkoff.

As described above, there are conventional devices in the prior art which perform NLFC of input beams in NLFC components which exhibit walkoff. In these examples the input beam is a Gaussian beam, or may be well approximated as a Gaussian beam, and the methods described by Boyd and Kleinman or by Freegarde et al. may be used to identify suitable strength of focussing of the input light to obtain NLFC with high efficiency. There are also conventional devices in the prior art which perform NLFC of non-diffraction-limited input beams (i.e. beams characterised by $M^2>1$ in at least one plane of the beam) in NLFC components which do not exhibit walkoff. In these examples the methods described by Blume et al. or in German patent application DE102007063492B4 may be used to identify suitable strength of focussing of the input light to obtain NLFC with high efficiency.

The present invention overcomes deficiencies of such conventional devices by performing NLFC characterized by both (1) performing NLFC of non-diffraction-limited input beams (i.e. beams characterised by $M^2>1$ in at least one plane of the beam), and (2) in NLFC components which exhibit walkoff. Furthermore, relatedly there are no methods described in the prior art which may be used to identify suitable strength of focussing of the input beam to obtain NLFC with high efficiency for non-diffraction-limited input beams in NLFC components which exhibit walkoff.

Figure 2:
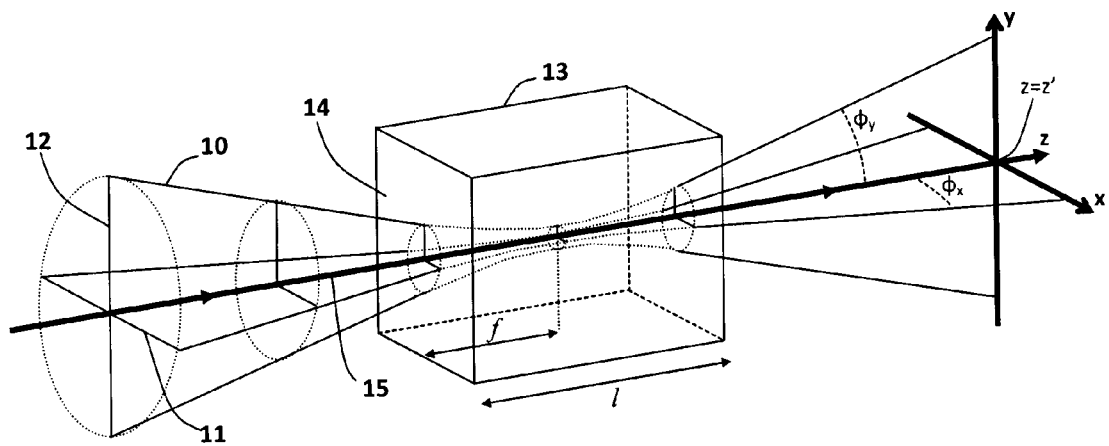
FIG. 2 is an illustration of a focussed input beam passing through an NLFC component

Through detailed analysis of the theory of NLFC of non-diffraction-limited beams in NLFC components which exhibit walkoff, the present inventors have identified a new method to identify suitable strength of focussing of an input beam to obtain high NLFC efficiency. For example, in the specific case of SHG, the power of frequency-doubled light may be determined using equation 6 below. The axes used in equation 6 are illustrated in FIG. 2. The propagation direction 15 of the input beam is parallel to the z-axis; a first plane 11 of the input beam contains the x-axis; a second plane 12 of the input beam contains the y-axis. The first and second planes of the input beam are perpendicular to one another. The input beam 10, propagates into the NLFC component 13 through a first surface 14 of the NLFC component; the direction normal to the first surface of the NLFC component is parallel to the z-axis. The walkoff plane of the NLFC component is parallel to the first plane 11 of the input beam. The second plane 12 of the input beam may be referred to as the non-walkoff-plane of the NLFC component.

$$P(z') \propto \int_{y'=-\infty}^{y'=+\infty} \int_{x'=-\infty}^{x'=+\infty} \left| -\frac{jk_2}{4n_2^2} dE_1^2 \exp \right. \quad \text{Equation 6}$$

$$\left. \left(-\frac{\alpha_2 l}{2}\right) \frac{1}{\sqrt{1+j\gamma_x}\sqrt{1+j\gamma_y}} \int_0^l A\,dz \right|^2 dx'\,dy'$$

The terms in Equation 6 are defined as follows:

$$A = \frac{\exp\left(-\left(\alpha_1 - \frac{\alpha_2}{2}\right)z\right)\exp(jz(k_2 - 2k_1))}{\sqrt{1+j\beta_x}\sqrt{1+j\beta_y}} \exp$$

$$\left(-\frac{2\pi^2 \phi_x^2 (1 - jM_x^2 \gamma_x)(x' - \rho(l-z))^2}{M_x^4 \lambda_1^2 (1+\gamma_x^2)} - \frac{2\pi^2 \phi_y^2 (1 - jM_y^2 \gamma_y)y'^2}{M_y^4 \lambda_1^2 (1+\gamma_y^2)}\right);$$

$z'$ is the position along the z-axis at which the power of the generated beam is calculated; $\lambda_1$ and $\lambda_2$ are the wavelengths respectively of the input light and generated light measured in air; $n_1$ and $n_2$ are the refraction indices of the NLFC component to light with wavelengths $\lambda_1$ and $\lambda_2$, taking account of the propagation direction and polarisation of the light relative to any optic axis or optic axes of materials in the NLFC component; $k_1 = 2\pi n_1/\lambda_1$; $k_2 = 2\pi n_2/\lambda_2$; d is the effective nonlinear optical coefficient for the harmonic generation process in the NLFC component;

$$\frac{1}{E_1} = \int_{y=-\infty}^{y=+\infty} \int_{x=-\infty}^{x=+\infty} \left[\exp\left(-\frac{x^2 \pi^2 \phi_x^2}{M_x^4 \lambda_1^2} - \frac{y^2 \pi^2 \phi_y^2}{M_y^4 \lambda_1^2}\right)\right]^2 dx\,dy;$$

$\alpha_1$ and $\alpha_2$ are the linear absorption coefficients in the NLFC component for light with wavelengths $\lambda_1$ and $\lambda_2$; l is the length of the NLFC component; f is the position of the input beam waist within the NLFC component, measured along the z axis from a first surface of the NLFC component;

$$\gamma_x = \frac{\pi n_1 \phi_x^2 (z' - f)}{\lambda_1 M_x^2};$$

$$\gamma_y = \frac{\pi n_1 \phi_y^2 (z' - f)}{\lambda_1 M_y^2};$$

$$\beta_x = \frac{\pi n_1 \phi_x^2 (z - f)}{\lambda_1 M_x^2};$$

$$\beta_y = \frac{\pi n_1 \phi_y^2 (z - f)}{\lambda_1 M_y^2};$$

$\phi_x$ and $\phi_y$ are the convergence or divergence half angles of the input beam in air in the first and second planes of the input beam respectively in units of radians; $M_x^2$ and $M_y^2$ are the beam quality factors of the input beam in the first and second planes of the input beam respectively; $\rho$ is the walkoff angle in the NLFC component, measured in radians.

Equation 6 provides, for the first time, a method to identify suitable strength of focussing for a non-diffraction-limited input beam to obtain SHG with high efficiency in a NLFC component which exhibits walkoff. The power of the generated light, P(z'), may be calculated for different values of $\phi_x$ and $\phi_y$ and therefore suitable values of $\phi_x$ and $\phi_y$ can be found for which the power of the generated light is high.

Figure 3:
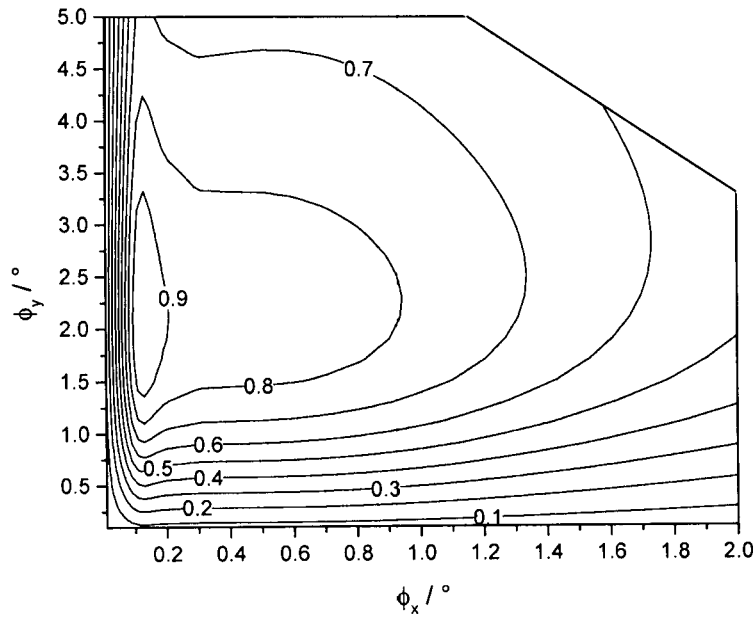
FIG. 3 is a contour plot showing the calculated dependence of power of generated light on the convergence half-angles in air of an input beam for an example case.

For example, the contour plot in FIG. 3 shows the calculated dependence of power of the generated light on $\phi_x$ and $\phi_y$ for a specific example of Type 1 SHG using an NLFC component including a crystal of β-BaB$_2$O$_4$ in which the input beam has a wavelength in air of $\lambda_1$=445 nm; where the beam quality factor of the input beam in the first plane of the beam ($M_x^2$) is approximately 4 and the beam quality factor of the input beam in the second plane of the beam ($M_y^2$) is approximately 6; the length of the β-BaB$_2$O$_4$ crystal (l) is approximately 7 mm; and the input beam propagates at an angle (θ) of approximately 65° from the optic axis of the β-BaB$_2$O$_4$ crystal such that the SHG walkoff angle (ρ) is approximately 4°.

Through extensive calculations based on the new equation 6, the present inventors have determined that to obtain high-efficiency SHG of a non-diffraction-limited input beam in a NLFC component which exhibits walkoff when the beam quality factor in the plane of the input beam which is parallel to the non-walkoff plane of the NLFC component ($M_y^2$ in equation 6) has a value greater than two, the suitable convergence half-angle in air for the input light in said plane of the beam ($\phi_y$ in equation 6) differs substantially from the convergence half-angle in air in said plane of the beam which would be suitable for a beam with $M_y^2 \approx 1$ in said plane of the input beam.

More specifically, when the beam quality factor in the plane of the input beam which is parallel to the non-walkoff plane of the NLFC component ($M_y^2$ in equation 6) has a value greater than two, to obtain high-efficiency SHG of the input beam the convergence half-angle in air for the input beam in said plane of the beam ($\phi_y$ in equation 6) should be larger than the convergence half-angle in air in said plane of the beam which would be suitable for a beam with $M_y^2 \approx 1$ in said plane of the input beam. This may be written as $\phi_y(M_y^2>2)>\phi_y(M_y^2=1)$.

More specifically still, when the beam quality factor in the plane of the input beam which is parallel to the non-walkoff plane of the NLFC component ($M_y^2$ in equation 6) has a value greater than two, to obtain high-efficiency SHG of the input beam the convergence half-angle in air for the input beam in said plane of the beam ($\phi_y$ in equation 6) should be approximately equal to $\epsilon \times M_y$ multiplied by the convergence half-angle in air in said plane of the beam which would be suitable for a beam with $M_y^2 \approx 1$ in said plane of the input beam, where $\epsilon$ has a value between a lower value equal to the larger of 0.4 and $$\frac{1}{M_y}$$

and upper value of 5, where $M_y$ is the square root of the beam quality factor. This may be written as $\phi_y(M_y^2)=\epsilon \times M_y \times \phi_y(M_y^2=1)$.

Yet more specifically, when the beam quality factor in the plane of the input beam which is parallel to the non-walkoff plane of the NLFC component ($M_y^2$ in equation 6) has a value greater than two, to obtain high-efficiency SHG of the input beam the convergence half-angle in air for the input beam in said plane of the beam ($\phi_y$ in equation 6) should be approximately equal to $M_y$ multiplied by the convergence half-angle in air in said plane of the beam which would be suitable for a beam with $M_y^2 \approx 1$ in said plane of the input beam. This may be written as $\phi_y(M_y^2) \approx M_y \times \phi_y(M_y^2=1)$, where $M_y$ is the square root of the beam quality factor.

$\phi_y(M_y^2=1)$, which is the convergence half-angle in air of the input beam in the plane of said beam which is parallel to the non-walkoff plane of the NLFC component which is suitable to obtain SHG with high efficiency when the input beam has a beam quality factor in said plane of the beam of $M_y^2 \approx 1$ may be calculated using the method described by Boyd and Kleinman or using the method described by Freegarde et al. The method described by Freegarde et al. is preferred.

For the case of SHG in NLFC components which exhibit walkoff, the dependence of the suitable strength of focussing of the input beam in the plane of the beam which is parallel to the non-walkoff plane of the NLFC component ($\phi_y$ in equation 6) on the beam quality factor in said plane of the beam is significantly different from the equivalent dependence described in the prior art for SHG in NLFC components which do not exhibit walkoff. In particular, the method described by Blume et al. leads to the conclusion that suitable convergence half-angle of an input beam with $M^2>1$ should be equal to the convergence half-angle which is suitable for $M^2 \approx 1$. And the method described in German patent application DE102007063492B4 shows that the suitable convergence half-angle of the input beam with $M^2>1$ should be less than the suitable convergence half-angle of the input beam with $M^2 \approx 1$.

Through further extensive calculations based on the new equation 6, the present inventors have determined that to obtain high-efficiency SHG of a non-diffraction-limited input beam in an NLFC component which exhibits walkoff when the beam quality factor in the plane of the input beam which is parallel to the walkoff plane of the NLFC component ($M_x^2$ in equation 6) has a value greater that two, the suitable convergence half-angle in air for the input light in said plane of the beam ($\phi_y$ in equation 6) depends on the range of wavelengths in the input beam. The optimal value for a particular device configuration may be determined using equation 6.

We now provide an example to show the suitable strength of focussing to obtain high-efficiency SHG with a NLFC component which exhibits walkoff for input beams where the beam quality factor of the input beam in the plane of the beam which is parallel to the non-walkoff plane of a NLFC component is larger than one. This particular example is for Type 1 SHG of input light with a wavelength in air of $\lambda_1 \approx 445$ nm in an NLFC component which includes a β-BaB$_2$O$_4$ crystal with a length, measured parallel to the propagation direction of the input beam, of 7 mm. The propagation direction of the input beam within the β-BaB$_2$O$_4$ crystal is at an angle (θ) of approximately 64.9° from the optic axis of the β-BaB$_2$O$_4$ crystal. This direction is suitable for phasematched Type 1 SHG of the input beam. The refractive indices of β-BaB$_2$O$_4$ may be calculated using the equations in "Nonlinear Optical Crystals: A Complete Survey" D. N. Nikogosyan (2005) and thereby the walk-off angle (ρ) in the β-BaB$_2$O$_4$ crystal for this configuration is found to be approximately 4°.

Application of the method described by Freegarde et al. to this SHG configuration yields a suitable convergence half-angle in air of the input beam, in the plane of the beam which is parallel to the non-walkoff plane of the β-BaB$_2$O$_4$ crystal, of $\phi_y(M_y^2=1) \approx 0.86°$ and a suitable convergence half-angle in air of the input beam, in the plane of the beam which is parallel to the walkoff plane of the β-BaB$_2$O$_4$ crystal, of $\phi_x(M_x^2=1) \approx 0.24°$.

The method described by Freegarde et al. is appropriate to an input beam with beam quality factors of $M_x^2 \approx 1$ and $M_y^2 \approx 1$ in the planes of the input beam parallel to the walkoff plane of the NLFC component and parallel to the non-walkoff plane of the NLFC component, respectively.

Figure 4:
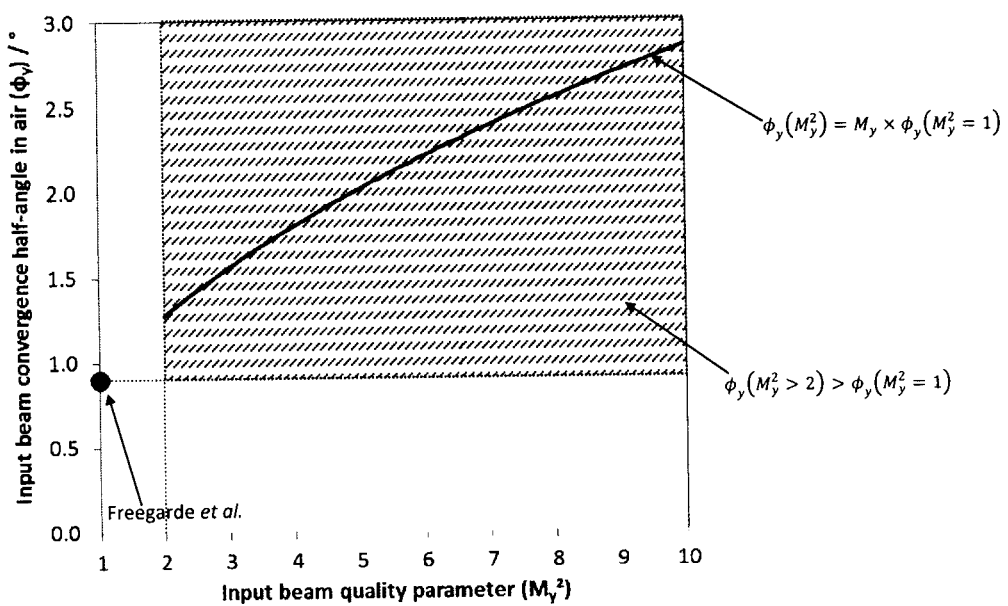
FIG. 4 is a graphical representation of the dependence of suitable convergence half-angles in air of an input beam on a beam quality factor of the input beam according to the present invention.

According to the present invention, suitable convergence half-angles in air for the input beam in the plane of the beam which is parallel to the non-walkoff plane of the NLFC crystal are defined according to: $\phi_y(M_y^2>2)>\phi_y(M_y^2=1)$. Preferably, suitable convergence half-angles in air for the input beam in the plane of the beam which is parallel to the non-walkoff plane of the NLFC crystal are defined according to: $\phi_y(M_y^2)\approx\epsilon\times M_y\times\phi_y(M_y^2=1)$, where $\epsilon$ has a value between a lower value equal to the larger of 0.4 and $$\frac{1}{M_y}$$

and an upper value of 5 and preferably $\epsilon\approx1$, and where $M_y$ is the square root of the beam quality factor. The dependence of suitable $\phi_y$ on the beam quality factor of the input beam ($M_y^2$) for the SHG configuration described above is plotted in FIG. 4.

There is no method in the prior art to identify suitable strength of focussing for a non-diffraction-limited input beam for an NLFC component which exhibits walkoff, such as the NLFC component including a β-BaB$_2$O$_4$ crystal as in the above example. As referenced above, the conventional methods in the prior art to identify suitable strength of focussing for non-diffraction-limited input beams are restricted to NLFC components which do no exhibit walk-off: the methods of Blume et al. and the method described in DE102007063492B4. It is not scientifically sensible to apply the methods in these latter two references to NLFC in NLFC components which exhibit walkoff, such as for an NLFC component which includes a β-BaB$_2$O$_4$ crystal as in the above example. However, if one were to incorrectly attempt to apply either of these methods to the above example one would obtain the result shown in FIG. 5. The method of Blume et al. wrongly identifies suitable strength of focussing according to $\phi_y(M_y^2>2)=\phi_y(M_y^2=1)$. The method described in DE102007063492B4 wrongly identifies suitable strength of focussing according to $$\phi_y(M_y^2 > 2) = \frac{1}{M_y^2} \times \phi_y(M_y^2 = 1).$$

Figure 5:
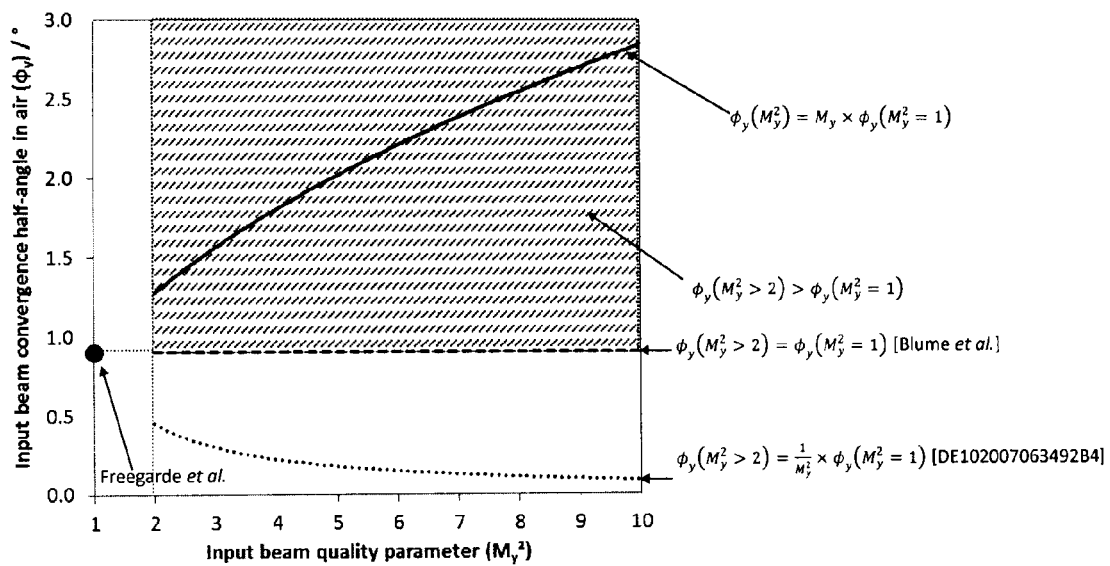
FIG. 5 is a graphical representation of the dependence of suitable convergence half-angles in air of an input beam on a beam quality factor of the input beam according to the present invention, and a comparison with prior art methods for NLFC components which do not exhibit walkoff.

It is clear from inspection of FIG. 5 that these two methods in the prior art are both inappropriate to identify suitable strength of focussing for NLFC in NLFC components which exhibit walkoff, and indeed that the behaviour identified in the prior art to be appropriate for NLFC components which do not exhibit walkoff teaches against use of larger convergence half-angles as the beam quality factor increases.

Through application of the present invention is becomes possible to obtain high NLFC efficiency even when the input beam is a non-diffraction-limited beam.

The suitable convergence half-angles in air described above apply to an input beam 10 propagating into a NLFC component 13 through a first surface 14 of the NLFC component, where said surface is a planar surface and where the direction normal to said surface is approximately parallel to the propagation direction of the input beam 10 (making reference to FIG. 2). If the first surface 14 of the NLFC component 13 is not planar, or if the direction normal to said surface is not approximately parallel to the propagation direction 15 of the input beam 10 then suitable convergence half-angles in air of the input beam should be modified from those described above. The modified suitable convergence half-angles in air may be determined using standard calculation methods (such as using ray transfer matrices, which are sometimes referred to as "ABCD matrices") such that the beam waist radii of the input beam in the first and second planes of the beam which form in the NLFC component, after propagation through the first surface of the NLFC component which is not planar and/or does not have a surface normal approximately parallel to the propagation direction of the input beam, are approximately equal to the beam waist radii of the input beam in the first and second planes of the beam which would form in the NLFC component after propagation of an input beam with the convergence half-angles in air described above into a NLFC component through a first surface of the NLFC component, where said surface is a planar surface and the direction normal to said surface is approximately parallel to the propagation direction of the input beam.

The suitable convergence half-angles in air described above apply to an input beam 10 propagating in a NLFC component 13 in which the refractive indices of the NLFC component to the input light and the generated light are not significantly affected by heating of the NLFC component caused by absorption of the input light or absorption of the generated light. This is the case when so-called "thermal lensing" effects in the NLFC component are not significant. If thermal lensing may occur in the NLFC component, then the suitable convergence half-angles in air of the input beam should be modified from those above to compensate for the focussing or defocussing effect of the thermal lens formed in the NLFC component.

In exemplary embodiments of the present invention, it can be advantageous for the beam quality factor of the input beam in the plane of the beam which is parallel to the walkoff plane of the NLFC component to be lower than the beam quality factor of the input beam in the plane of the beam which is parallel to the non-walkoff plane of the NLFC component. This may be represented as $M_x^2<M_y^2$. In particular, use of an input beam with $M_x^2<M_y^2$ can provide higher efficiency NLFC than use of an otherwise equivalent input beam which has $M_x^2>M_y^2$. A further exemplary embodiment of the current invention includes use of a polarisation-altering element, such as a half wave plate, to provide an input beam for a NLFC process where said input beam has $M_x^2<M_y^2$.

The invention is described further with respect to the following, non-limiting examples. Generally, an aspect of the inventions is a nonlinear frequency conversion (NLFC) component is incorporated into a light source. The light source includes a light emitting element that emits a non-diffraction limited input light beam, and the NLFC component that exhibits walkoff and performs an NLFC process, such as for example second harmonic generation. An optical component is configured to converge the non-diffraction limited input beam into the NLFC component with a determined convergence half-angle. The convergence half-angle in air in a non-walkoff plane of the NLFC component is larger than a convergence half-angle angle for diffraction-limited light. Said convergence half-angle may be the square root of a beam quality factor of the input beam in the non-walkoff plane multiplied by the convergence half-angle for diffraction-limited light. Said convergence half-angle further may be a multiple of the beam factor of the input beam in the non-walkoff plane, $\epsilon\times M_y$, multiplied by the convergence half-angle value for diffraction-limited light, wherein $\epsilon$ has a value between a lower value equal to the larger of 0.4 and $$\frac{1}{M_y}$$

and an upper value of 5.0, and where $M_y$ is the square root of the beam quality factor.

Example 1

A first example is a device for generation of ultraviolet light which has significant advantages over conventional devices in the prior art. The device includes a laser diode which emits non-diffraction-limited light, and this light undergoes SHG in an NLFC component resulting in a generated beam with wavelength shorter than 300 nm.

Figure 6:
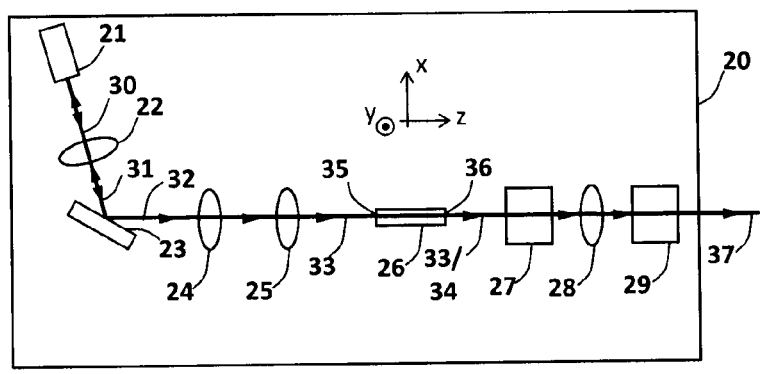
FIG. 6 is a top plan view of the component configuration of a light source according to an exemplary embodiment of the invention.

A schematic diagram of an exemplary laser device is shown in FIG. 6. The x-axis, y-axis and z-axis are defined in FIG. 6, and all references to these axes in the following description of this first example refer to this definition. The x-axis and z-axis are in the plane of the diagram in FIG. 6 and the y-axis is perpendicular to the plane of the diagram. A light source 20 includes a light emitting element such as a laser diode 21, an aspheric lens 22, a dichroic component 23, a first cylindrical lens 24, a second cylindrical lens 25, an NLFC component 26, a first filter 27, a spherical lens 28 and a second filter 29.

The laser diode emits light with a wavelength in air between 410 nm and 600 nm. The laser diode may preferably include $Al_yIn_xGa_{1-x-y}N$ semiconductor materials. Preferably, the laser diode emits a wavelength in air of approximately 445 nm and this wavelength is assumed for the remainder of the description of this first example. Typically laser diodes emit light with a small range of wavelengths—for example a range of ±0.5 nm from a centre wavelength—but for convenience we refer to emission as occurring at a single wavelength. The path of the light emitted from the laser diode is shown by the line labelled as 30, 31, 32 and 33 in FIG. 6. If the light emitted by the laser diode has a dominant linear polarisation in one plane of the emitted beam, then the orientation of the laser diode may be chosen so that the direction of the dominant electric field component is approximately parallel to the y-axis, or alternatively so that the direction of the dominant electric field component is approximately parallel to the x-axis. Preferably, the light emitted by the laser diode 21 has a dominant linear polarisation in one plane of the emitted beam. Preferably, the orientation of the laser diode is chosen so that the direction of the dominant electric field component is approximately parallel to the y-axis and this is assumed for the remainder of the description of this first example.

The aspheric lens 22 collects the divergent beam emitted by the laser diode 30 and converts the beam into a beam with low divergence in at least one plane of the beam 31. The aspheric lens 22 may have an effective focal length of between 0.1 mm and 10 mm and preferably has a focal length of approximately 3 mm.

The beam with low divergence in at least one plane of the beam 31 is incident on a dichroic component 23. A portion of the beam 31 is transferred into a feedback beam by the dichroic element. The dichroic element is oriented so that the feedback beam propagates along the same path as the beam 30 and the beam 31 but in the opposite direction such that the feedback beam propagates towards the laser diode 21. The feedback beam may have the effect of either one or both of stabilising the emission wavelength of the laser diode and reducing the range of wavelengths of light emitted by the laser diode 21. It is preferred that the feedback beam reduces the range of wavelengths of light emitted by the laser diode 21. Preferably, the range of wavelengths of light emitted by the laser diode 21 is less than 0.2 nm, and most preferably the range of wavelengths is less than 0.1 nm. The power of the feedback beam may be between 1% and 50% of power of the beam 31, and is preferably between 5% and 15% of the power of the beam 31.

The dichroic element may be a surface diffraction grating, for example, with 3600 lines per millimeter. The dichroic element may also be a volume Bragg grating. The dichroic element 23 also reflects or transmits a portion of the beam 31 into a source beam 32 which propagates towards the first cylindrical lens 24.

The light source further includes an optical component that is configured to converge the non-diffraction limited input beam into the NLFC component. The optical component may include one or more lens elements that converge the input beam into the NLFC component with a determined convergence half-angle. In exemplary embodiments, the source beam 32 propagates through the first cylindrical lens 24 and the second cylindrical lens 25, and the output beam from the lens 25 is referred to as the input beam 33 which propagates into the NLFC component 26. The first cylindrical lens 24 is oriented so that said lens either deflects (or "focuses") light mostly in a direction approximately parallel to the x-axis or so that said lens deflects light mostly in a direction approximately parallel to the y-axis. If the first cylindrical lens 24 is oriented so that said lens deflects light mostly in a direction approximately parallel to the x-axis, then the second cylindrical lens 25 is oriented to deflect light mostly in a direction approximately parallel to the y-axis. Alternatively, if the first cylindrical lens 24 is oriented so that said lens deflects light mostly in a direction approximately parallel to the y-axis, then the second cylindrical lens 25 is oriented to deflect light mostly in a direction approximately parallel to the x-axis. In a preferred example, the first cylindrical lens 24 is oriented so that said lens deflects light mostly in a direction approximately parallel to the x-axis, and this is assumed for the remainder of the description for this first example.

The first cylindrical lens 24 is positioned so that as the input beam 33 propagates towards the NLFC component 26, the input beam 33 converges in a first plane of the beam such that the convergence half-angle in air in the first plane of the beam is equal to $\phi_x$. The first plane of the beam is approximately parallel to the plane containing the x-axis and z-axis. The beam may then form a beam waist in the first plane of the beam which is located within the NLFC component. The second cylindrical lens 25 is positioned so that as the input beam 33 propagates towards the NLFC component 26, the input beam 33 converges in a second plane of the beam such that the convergence half-angle in air in the second plane of the beam is equal to $\phi_y$. The second plane of the beam is approximately parallel to the plane containing the y-axis and z-axis. The beam may then form a beam waist in the second plane of the beam which is located within the NLFC component. Preferably the position of the beam waist in the first plane of the beam and the position of the beam waist in the second plane of the beam are within 5 mm of one another, more preferably within 1 mm of one another, and most preferably within 0.1 mm of one another.

The input beam 33 propagates into the NLFC component 26 and undergoes SHG in the NLFC component 26, resulting in generation of a generated beam 34. For this first example where the input beam has a wavelength in air of approximately 445 nm, the generated beam has a wavelength in air of approximately 222.5 nm. Either the input beam 33 or the generated beam 34 exhibit walkoff within the NLFC component.

The NLFC component 26 may include any material with non-zero second order nonlinear susceptibility. For example, the NLFC component 26 may include a β-BaB$_2$O$_4$ crystal. The cut and orientation of the β-BaB$_2$O$_4$ crystal may be set to provide phasematched Type 1 SHG of the input beam 33. An example of a suitable orientation for the crystal is: the <2 –1 –1 0> crystal direction approximately parallel to the y-axis, the <0 0 0 1> crystal direction approximately parallel to the plane containing the x-axis and z-axis, and the angle between the propagation direction of the input beam within the β-BaB$_2$O$_4$ crystal and the <0 0 0 1> crystal direction approximately θ, where θ depends on the wavelength of the input beam, according to the list in FIG. 7. For the remainder of the description for this first example, it is assumed that the NLFC component includes a β-BaB$_2$O$_4$ crystal with the orientation described above where θ≈64.9°.

For Type 1 SHG in a β-BaB$_2$O$_4$ crystal, the generated beam exhibits relatively large walkoff when 0°<θ<90°. For the example, when θ≈64.9° the walkoff angle (ρ) of the generated beam is ρ≈4°. For the orientation of the β-BaB$_2$O$_4$ crystal stated above, the walkoff plane of the NLFC component is approximately parallel to the plane containing the x-axis and z-axis, and the non-walkoff plane of the NLFC component is approximately parallel to the plane containing the y-axis and z-axis.

The input beam 33 propagates into the NLFC component 26 through a first surface 35 of the NLFC component. The normal to the plane of the first surface 35 of the NLFC component is approximately parallel to the propagation direction of the input beam 33. The NLFC component 26 may have a length, measured parallel to the direction of the propagation axis of the input beam, of between 1 mm and 20 mm. Preferably, the NLFC component 26 has a length of approximately 5-15 mm. For the remainder of the description of this first example, it is assumed that the NLFC component has a length of 7 mm.

The input beam 33 and generated beam 34 both propagate out of the NLFC component through a second surface 36 of the NLFC component, as depicted in the dual reference numeral 33/34 in FIG. 6. In other words, the output of the NLFC component includes a first beam component having a wavelength of the input beam 33, and a second beam constituting the frequency-double generated beam 34. These two beams may propagate into a first filter 27. The first filter 27 attenuates the power of the input beam 33 by a greater amount than it attenuates the power of the generated beam 34. After exiting the first filter 27, either or both of the input beam and generated beam may be collimated or focussed by a lens 28. The input beam and generated beam may then pass through a second filter 29. The second filter 29 attenuates the power of the input beam 33 by a greater amount than it attenuates the power of the generated beam 34. The portion of the generated light 34 is emitted from the light source as emitted light 37.

The beam quality factor of the source beam 32 in the first plane of the beam is $M_x^2$ and may be in the range $1<M_x^2<100$, and is preferably in the range $1<M_x^2<10$. The beam quality factor of the source beam 32 in the second plane of the beam is $M_y^2$ and may be in the range $2<M_y^2<100$, and is preferably in the range $2<M_y^2<10$. If they are not already known, the beam quality factors of the source beam 32 in the first and second planes of the beam may be measured using standard procedures as defined in ISO11146 (2005). For the remainder of the description of the first example, the beam quality factors of the source beam are $M_x^2=4.0$ and $M_y^2=6.0$.

The suitable convergence half-angle in air of the input beam in the second plane of the beam ($\phi_y$) to achieve high SHG efficiency is determined according to a parameter established as part of the current invention; namely that $\phi_y(M_y^2>2)>\phi_y(M_y^2=1)$. The suitable convergence half-angle in air for a diffraction-limited beam ($M_y^2=1$) may be determined according to the method described by Freegarde et al. For the specific example of a NLFC component including a 7 mm long β-BaB$_2$O$_4$ crystal oriented as described above, with θ≈64.9° and a walkoff angle of ρ≈4°, the method of Freegarde et al. yields a suitable convergence half-angle in air of the input beam in the second plane of the beam to be $\phi_y(M_y^2=1)\approx0.86°$. Consequently a suitable convergence half-angle in air in the second plane of the input beam in the second plane of the input beam with $M_y^2=6.0$ is $\phi_y(M_y^2=6.0)>0.86°$.

According to another exemplary embodiment of the current invention, the suitable convergence half-angle in air of the input beam in the second plane of the beam ($\phi_y$) to achieve high SHG efficiency is $\phi_y(M_y^2)\approx\epsilon\times M_y\times\phi_y(M_y^2=1)$, where $\epsilon$ has a value between a lower value equal to the larger of 0.4 and $$\frac{1}{M_y}$$

and an upper value of 5 and preferably $\epsilon\approx1$, and where $M_y$ is the square root of the beam quality factor. Consequently a suitable convergence half-angle in air in the second plane of the input beam with $M_y^2=6.0$ is between a value of $\phi_y(M_y^2=6.0)=0.86°$ and $\phi_y(M_y^2=6.0)=10.53°$ (or taking into account typical measurement tolerances, between 0.9° and 10.5°) and preferably is a value of $\phi_y(M_y^2=6.0)\approx2.1\pm1°$. The focal length of the second cylindrical lens 25 is chosen to provide suitable convergence half-angle in air of the input beam in the second plane of the beam. For the specific configuration of the example set out above, the focal length of the second cylindrical lens, $f_2$, may be $f_2<75$ mm to ensure $\phi_y>0.86°$. Furthermore, said focal length may be in the range 5 mm$<f_2<75$ mm, or more preferably 10 mm$<f_2<50$ mm or most preferably $f_2\approx20$ mm to obtain $\phi_y\approx2.11°$.

The focal length of the first cylindrical lens 24 is chosen to provide suitable convergence half-angle in air of the input beam in the first plane of the beam to obtain SHG with high efficiency. For the specific configuration of the first example set out above, the focal length of the first cylindrical lens, $f_1$, may be in the range between 50 mm and 500 mm and is preferably approximately 100 mm.

Appropriate focal lengths for the first and second cylindrical lenses depend on the properties of the source beam 32, such as the beam width of the source beam and the convergence or divergence half-angle in air of the source beam. The focal lengths should be selected to provide an input beam with suitable convergence half-angles in air in the first and second planes of the input beam to obtain NLFC with high efficiency.

An advantage of the invention is illustrated using comparative experimental examples. A first light source was produced with the configuration described above, using a convergence half-angle in air of the input beam in the second plane of the beam corresponding to $\phi_y\approx2.11°$. A second light source was produced with the same configuration as the first light source except for use of a convergence half-angle in air of the input beam in the second plane of the beam of $\phi_y\approx0.86°$ which corresponds to the value which would be suitable for diffraction-limited light according to the method described by Freegarde et al. A third light source was produced with the same configuration as the first light source expect for use of a convergence half-angle in air of the input beam in the second plane of the beam of $\phi_y \approx 0.14°$ which corresponds to the value which would be suitable for a beam quality factor of $M_y^2=6.0$ for SHG in a NLFC which does not exhibit walkoff according to DE102007063492B4. The first, second and third light sources were carefully optimised to obtain the maximum power of the generated beam. The power of the generated beam from the first light source was 235% of the power of the generated beam from the second light source. The power of the generated beam from the third light source was very significantly lower than the power generated by the second light source and was too low to measure with high accuracy. These comparative examples demonstrate the very significant advantage of the present invention.

Figure 8:
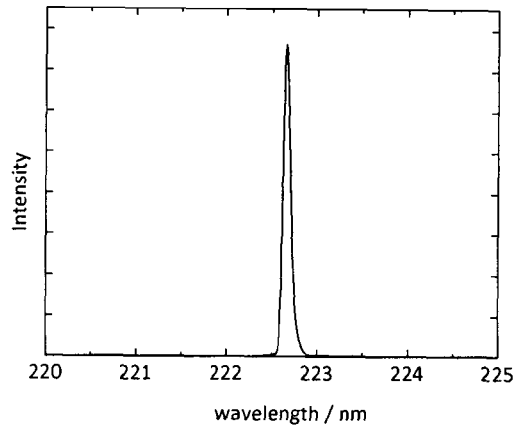
FIG. 8 is a graph of a spectrum of light emitted from a light source according to one exemplary embodiment of the present invention.

Light sources fabricated according to the design in the above example provide very significant advantages over light sources in the prior art. The first light source provided a generated beam with a wavelength in air of approximately 222.5 nm and an output power of the generated beam exceeding 0.26 mW. The emission spectrum from this light source is shown in FIG. 8.

The closest example in the prior art of a light source using SHG of light emitted from a laser diode in a bulk β-BaB$_2$O$_4$ crystal to generate a beam with wavelength in the range 210-230 nm is the device described by Tangtronbenchasil et al. [Japanese Journal of Applied Physics 47 2137 (2008)]. In that device the light emitted from the laser diode was focussed according to the strength of focussing identified as suitable for diffraction-limited light according to the method of Boyd and Kleinman. The output power of the generated beam in said device was less than 0.001 mW. The first light source described in the current example clearly demonstrates a very significant increase in optical power of the generated beam.

An aspect of the increase in performance is that the present invention includes the use of laser diodes emitting non-diffraction-limited light to provide the input beam for NLFC in NLFC components which exhibit walkoff, such as SHG in a NLFC component including a β-BaB$_2$O$_4$ crystal. This enables use of higher power laser diodes and thereby an increase in the power of the generated beam. For example, this enables use of laser diodes with relatively large emission region.

Figure 9:
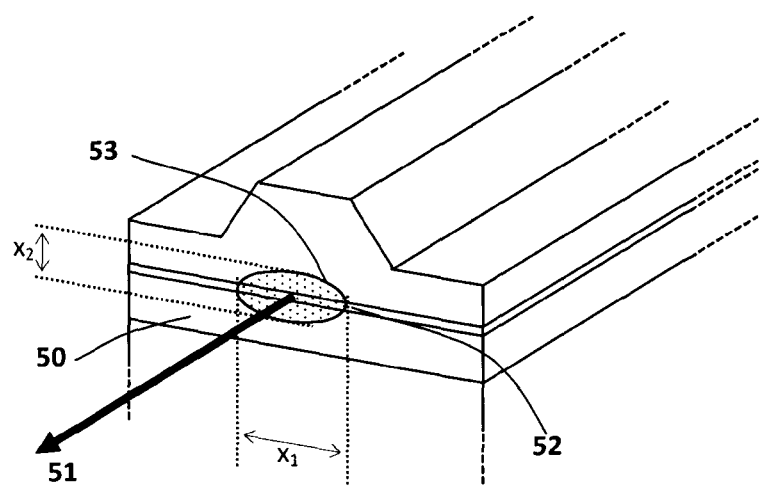
FIG. 9 is an illustration including the emission region of a laser diode

A schematic diagram showing features of a laser diode is shown in FIG. 9. The emission surface of a laser diode 50 is a surface from which output light 51 is emitted. The laser diode includes light-emitting material 52 and a waveguide which constrains light generated in the laser diode in a first direction (parallel to the direction labelled $x_1$) and in a second direction (parallel to the direction labelled $x_2$). If the laser diode is fabricated from a wafer including layers of different composition deposited onto a plane of a substrate, the first direction is parallel to the plane of the wafer and the second direction is perpendicular to the plane of the wafer. The output light 51 is emitted from the emission region 53, which is a two dimensional region of the emission surface 50 and is characterised by a breadth ($x_1$) and a height ($x_2$), as labelled in FIG. 9. In the example of FIG. 9 the emission region 53 is indicated by an elliptical shape, but the shape of the emission region is not necessarily elliptical. The dimensions of the emission region of a laser diode may be determined by imaging the output surface of the laser diode while it is operating. Alternatively the dimensions of the emission region of a laser diode may be determined by measuring the beam widths of the output light at several positions along the beam propagation direction and comparing with Equation 4 to determine the breadth and height of the beam at the position of the emission surface. In both of the above cases it is preferred to use the d4σ (d-4-sigma) method to determine the beam widths and the breadth and height of the emission area.

The beam quality factor of the output light may depend on the breadth and height of the emission region. For example, if the breadth ($x_1$) of the emission region 53 is large then the beam quality factor of the output light 51 may be large in at least one plane of the beam, and particularly in the plane of the output beam which is parallel to the direction labelled as $x_1$.

An aspect of the current invention includes use of a laser diode to generate the input beam for the NLFC process where the emission region of the laser diode has either a breadth ($x_1$) or height ($x_2$) between 0.5 μm and 500 μm, preferably between 3 μm and 20 μm, and most preferably between 5 μm and 15 μm.

This invention provides, for the first time, a device which can use a laser diode with such an emission region, and consequently a beam quality factor of at least two in at least one plane of the emitted beam, to provide an input beam for a NLFC process which provides high efficiency NLFC.

In this description of the first example, the strength of focussing of the input light has been described in terms of the convergence half-angles in air of the input beam in the first and second planes of the input beam. The strength of focussing could also be described in terms of the divergence half-angles in air of the input beam after it has propagated through the NLFC component. If the second surface of the NLFC component 36 is a planar surface and the direction perpendicular to said surface is approximately parallel to the propagation direction of the input beam 33 then suitable divergence half-angles are approximately the same as the suitable convergence half angles described above. If the second surface of the NLFC component 36 is not planar, or the direction perpendicular to said surface is not approximately parallel to the propagation direction of the input beam 33, then suitable divergence half-angles may be determined using standard methods, such as ray transfer methods in a similar way as for the case described above where the first surface of the NLFC component 35 is not planar or the direction perpendicular to the first surface of the NLFC component 35 is not approximately parallel to the propagation direction of the input beam 33.

In this description of the first example. the convergence half-angles in air in the first and second planes of the input beam are set to suitable values using an optical component having a first cylindrical lens and a second cylindrical lens. Many other optical components may be used to provide the required convergence half-angles in air for the input beam in the first and second planes of the beam. For example, instead of the first cylindrical lens, two or more cylindrical lenses may be used to provide the required convergence half-angle of the input beam in the first plane of the beam. In a specific example, a first cylindrical lens with a focal length of $f_1$=100 mm may be replaced by a third cylindrical lens with focal length $f_3$=20 mm followed by a fourth cylindrical lens with a focal length of $f_4$=−3.9 mm (the value of $f_4$<0 indicates that this is a defocussing lens, such as a plano-concave cylindrical lens). The positions of the third and fourth cylindrical lenses are set to provide the suitable convergence half-angle in air in the first plane of the beam. An advantage of the use of third and fourth cylindrical lenses instead of a first cylindrical lens is that the total distance from the laser diode to the NLFC component may be smaller, and therefore the light emitting device may be more compact. Similarly, the second cylindrical lens may be replaced by two cylindrical lenses. Furthermore, the suitable convergence half-angles in air of the input beam in the first and second planes of the input beam may be provided through use of one or more spherical lenses, or a combination of spherical and cylindrical lenses. Furthermore, the aspheric lens may be replaced by a spherical lens or one or more cylindrical lenses. In a specific example, the aspheric lens may be replaced by a fifth cylindrical lens which focus the divergent light emitted from the laser diode in the plane containing the x-axis and z-axis and a sixth cylindrical lens which focusses the divergent light emitted from the laser diode in the plane containing the y-axis and z-axis. Furthermore, all cylindrical lenses described in this first example may be replaced by acylindrical lenses. Both cylindrical and acylindrical lenses focus light mostly in only one plane. However, while the curved surfaces of cylindrical lenses are sections of a cylinder, the curved surfaces of acylindrical lenses are not necessarily sections of a cylinder.

Figure 10:
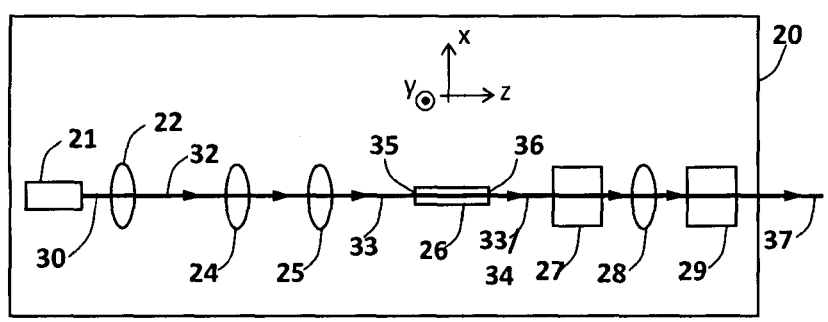
FIG. 10 is a top plan view of the component configuration of a light source according to an exemplary embodiment of the invention

In this description of the first example, a dichroic element 23 is included, which may either or both reduce the range of wavelengths of light emitted by the laser diode and stabilise the wavelength of light emitted by the laser diode. It is possible to omit the dichroic element 23 and still obtain advantages of the invention. If the dichroic element 23 is omitted from the light source 20, the beam with low divergence in at least one plane of the beam 30 is equivalent to the source beam 32. A schematic diagram of a light source 20 without a dichroic element is shown in FIG. 10. The labels in FIG. 10 have the same meaning as the labels in FIG. 6.

Figure 11:
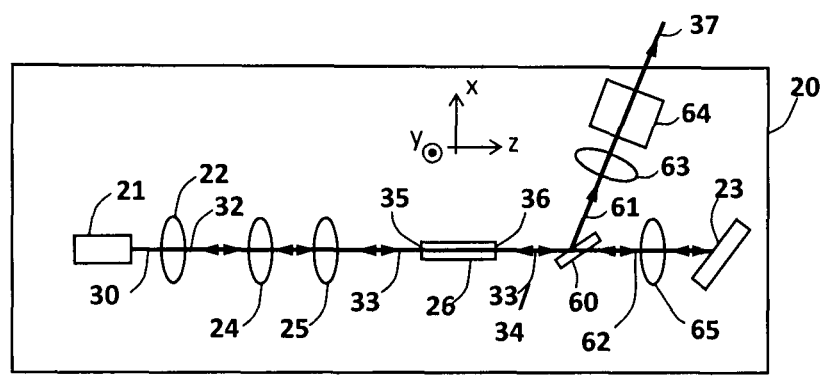
FIG. 11 is a top plan view of the component configuration of a light source according to an exemplary embodiment of the invention

Furthermore, the dichroic element 23 may be used so that the light emitted from the laser diode 21 passes through the NLFC component 26 before it is incident on said dichroic element. This configuration is shown in FIG. 11, in which elements common to the description of the first example above are labelled with the same numbers and their description will not be repeated. After propagating through the NLFC component 26, the input beam and the generated beam are incident on a dichroic mirror 60 which reflects a portion of the generated beam into a reflected generated beam 61, and which transmits a portion of the input beam. The transmitted portion of the input beam is referred to as the transmitted input beam 62. The reflected generated beam 61 may be collimated or focused by a lens 63 and may propagate through a filter 64, which attenuates the power of any residual light from the input beam by a greater amount than it attenuates the power of the reflected generated beam. The transmitted input beam 62 is collimated or focussed by at least one lens 65 and is then incident on the dichroic element 23. A portion of the transmitted input beam 62 is transferred into a feedback beam by the dichroic element. The dichroic element is oriented so that the feedback beam propagates along the same path as the beams 62, 33, 32 and 30 but in the opposite direction such that the feedback beam propagates towards the laser diode 21. The feedback beam may have the effect of either one or both of stabilising the emission wavelength of the laser diode and reducing the range of wavelengths of light emitted by the laser diode 21. It is preferred that the feedback beam reduces the range of wavelengths of light emitted by the laser diode 21. Preferably the range of wavelengths of light emitted by the laser diode 21 is less than 0.2 nm, and most preferably the range of wavelengths is less than 0.1 nm. The power of the feedback beam may be between 1% and 100% of power of the beam 62 and is preferably at least 70%, and most preferably at least 90% of the power of the beam 62. The dichroic element may be a surface diffraction grating, for example with 3600 lines per millimeter. The dichroic element may also be a volume Bragg grating. The dichroic element may also be a dichroic mirror.

The first example was described for a NLFC component including $\beta$-BaB$_2$O$_4$. The NLFC component may include one or more of the following materials: $\beta$-BaB$_2$O$_4$, LiB$_3$O$_5$, LiNbO$_3$, KTiOPO$_4$, AgGaS$_2$, AgGaSe$_2$, ZnGeP$_2$, GaSe, Al$_x$Ga$_{1-x}$N (where 0≤x≤1), KH$_2$PO$_4$, NH$_4$H$_2$PO$_4$, KD$_2$PO$_4$, CsLiB$_6$O$_{10}$, MgO:LiNbO$_3$, KTiOAsO$_4$, KNbO$_3$, LiTaO$_3$, RbTiOAsO$_4$, BaTiO$_3$, MgBaF$_4$, GaAs, BiB$_3$O$_6$, K$_2$Al$_2$B$_2$O$_7$, KBe$_2$BO$_3$F$_2$, BaAlBO$_3$F$_2$, La$_2$CaB$_{10}$O$_{19}$, GdCa$_4$O(BO$_3$)$_3$, YCa$_4$O(BO$_3$)$_3$, Gd$_x$Y$_{1-x}$Ca$_4$O(BO$_3$)$_3$ (where 0≤x≤1), Li$_2$B$_4$O$_7$, LiRbB$_4$O$_7$, CdHg(SCN)$_4$, Nb:KTiOPO$_4$, RbTiOPO$_4$, LiInS$_2$, LiInSe$_2$, LiGaS$_2$, LiGaSe$_2$, Ag$_x$Ga$_x$In$_{1-x}$Se$_2$ (where 0≤x≤1), Tl$_4$HgI$_6$, KB$_5$O$_8$.4H$_2$O, CsB$_3$O$_5$, C$_4$H$_7$D$_{12}$N$_4$PO$_7$, $\alpha$-HIO$_3$, LiCOOH.H$_2$O, CsH$_2$AsO$_4$, CsD$_2$AsO$_4$, RbH$_2$PO$_4$, CsTiOAsO$_4$, Ba$_2$NaNb$_5$O$_{15}$, CO(NH$_2$)$_2$, LiIO$_3$, Ag$_3$AsS$_3$, HgGa$_2$S$_4$, CdGeAs$_2$, Tl$_3$AsSe$_3$, CdSe.

Example 2

A second example of this invention is now described. This second example is similar to the first example and common features will not be repeated. In this second example of the invention, the NLFC component 26 includes a $\beta$-BaB$_2$O$_4$ crystal which has a length, measured along the propagation direction of the input beam 33, of 15 mm. The orientation of the $\beta$-BaB$_2$O$_4$ crystal is the same as for the first example. The source beam 32 has the same properties as for the first example, for example a wavelength in air of approximately 445 nm and beam quality factors of $M_x^2=4.0$ and $M_y^2=6.0$ in the first and second planes of the beam respectively.

The suitable convergence half-angle in air of the input beam in the second plane of the beam ($\phi_y$) to achieve high SHG efficiency is determined according to an aspect of the current invention; namely that $\phi_y(M_y^2>2)>\phi_y(M_y^2=1)$. The suitable convergence half-angle in air for a diffraction-limited beam ($M_y^2=1$) may be determined according to the method described by Freegarde et al. For the specific example of a NLFC component including a 15 mm long $\beta$-BaB$_2$O$_4$ crystal oriented as described above, with $\theta \approx 64.9°$ and a walkoff angle of $\rho \approx 4°$, the method of Freegarde et al. yields a suitable convergence half-angle in air of the input beam in the second plane of the beam to be $\phi_y(M_y^2=1) \approx 0.61°$. Consequently a suitable convergence half-angle in air in the second plane of the input beam in the second plane of the input beam with $M_y^2=6.0$ is $\phi_y(M_y^2=6.0)>0.61°$.

According to another aspect of the current invention, the suitable convergence half-angle in air of the input beam in the second plane of the beam ($\phi_y$) to achieve high SHG efficiency is $\phi_y(M_y^2) \approx \epsilon \times M_y \times \phi_y(M_y^2=1)$, where $\epsilon$ has a value between a lower value equal to the larger of 0.4 and $$\frac{1}{M_y}$$

and an upper value of 5 and preferably $\epsilon \approx 1$, and where $M_y$ is the square root of the beam quality factor. Consequently a suitable convergence half-angle in air in the second plane of the input beam with $M_y^2=6.0$ is between a value of $\phi_y(M_y^2=6.0)=0.61°$ and $\phi_y(M_y^2=6.0)=7.47°$ and preferably is a value of $\phi_y(M_y^2=6.0) \approx 1.49°$.

The focal length of the second cylindrical lens 25 is chosen to provide suitable convergence half-angle in air of the input beam in the second plane of the beam.

Example 3

A third example of the invention is now described. This third example is similar to the first example and common features will not be repeated. In this third example of the invention, the light emitted by the laser diode has a wavelength in air of approximately 416 nm. The beam quality factors of the source beam 32 are $M_x^2=5.0$ and $M_y^2=8.0$.

The NLFC component 26 includes a β-BaB$_2$O$_4$ crystal with the same orientation as for the first example, except that θ≈79.3° to provide Type 1 phase matching for a input beam with wavelength in air of 416 nm. For this example, when θ≈79.3°, the walkoff angle (ρ) of the generated beam is ρ≈2°.

The suitable convergence half-angle in air of the input beam in the second plane of the beam ($\phi_y$) to achieve high SHG efficiency is determined according to an aspect of the current invention; namely that $\phi_y(M_y^2>2)>\phi_y(M_y^2=1)$. The suitable convergence half-angle in air for a diffraction-limited beam ($M_y^2=1$) may be determined according to the method described by Freegarde et al. For the specific example of a NLFC component including a 7 mm long β-BaB$_2$O$_4$ crystal oriented as described above, with θ≈79.3° and a walkoff angle of ρ≈2°, the method of Freegarde et al. yields a suitable convergence half-angle in air of the input beam in the second plane of the beam to be $\phi_y(M_y^2=1)\approx0.87°$. Consequently a suitable convergence half-angle in air in the second plane of the input beam in the second plane of the input beam with $M_y^2=8.0$ is $\phi_y(M_y^2=8.0)>0.87°$.

According to another aspect of the current invention the suitable convergence half-angle in air of the input beam in the second plane of the beam ($\phi_y$) to achieve high SHG efficiency is $\phi_y(M_y^2)\approx\epsilon \times M_y \times \phi_y(M_y^2=1)$, where ε has a value between a lower value equal to the larger of 0.4 and $$\frac{1}{M_y}$$

and an upper value of 5 and preferably ε≈1, and where $M_y$ is the square root of the beam quality factor. Consequently a suitable convergence half-angle in air in the second plane of the input beam with $M_y^2=8.0$ is between a value of $\phi_y(M_y^2=8.0)=0.98°$ and $\phi_y(M_y^2=8.0)=12.30°$ and preferably is a value of $\phi_y(M_y^2=8.0)\approx2.46°$. The focal length of the second cylindrical lens 25 is chosen to provide suitable convergence half-angle in air of the input beam in the second plane of the beam.

Example 4

A fourth example of the invention is now described. This fourth example is similar to the first example and common features will not be repeated. A polarisation-altering element 70 is used in this fourth example of the invention. The polarisation-altering element may be used to provide an input beam for an NLFC process, in a NLFC component which exhibits walkoff, in which the beam quality factor of the input beam in the plane of the beam which is parallel to the walkoff plane of the NLFC component is lower than the beam quality factor of the input beam in the plane of the beam which is parallel to the non-walkoff plane of the NLFC component.

Figure 12:
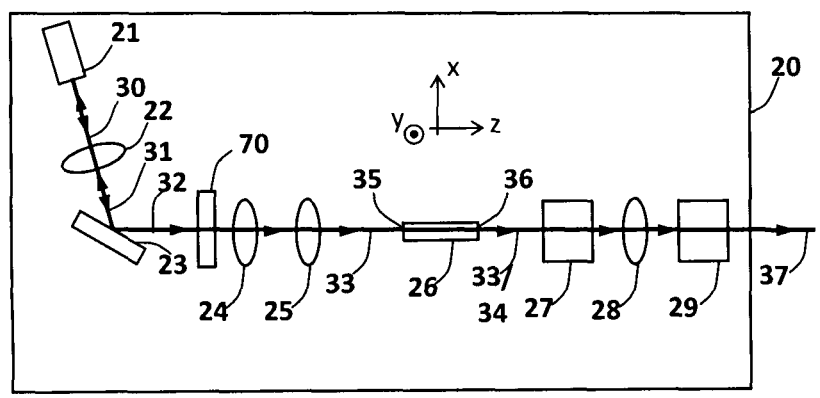
FIG. 12 is a top plan view of the component configuration of a light source according to an exemplary embodiment of the invention

A schematic diagram to illustrate the fourth example is shown in FIG. 12. There are several common features between FIG. 12 and FIG. 6 and these common features are indicated by the same numerical labels. A polarisation-altering element 70 is located at any position along the light beam path between the laser diode 21 and the NLFC component 26. In the example in FIG. 12 the polarisation-altering element 70 is located between the dichroic element 23 and the first cylindrical lens 24. The polarisation-altering element 70 changes the polarisation state of the source beam 32. In a preferred example, the polarisation-altering element 70 includes a 'half wave plate', also known as a 'λ/2 waveplate; or a 'lambda/2 waveplate'. A half wave plate changes the orientation of the polarisation of linearly polarised light from one plane of the beam to a different plane of the beam. In a preferred example the polarisation-altering element 70 includes a half wave plate which is oriented so that the direction of the dominant electric field components in the source beam is rotated by 90° as the source beam propagates through the polarisation-altering element 70. For example, if the dominant electric field components of the source beam are approximately parallel to the x-axis before propagating through the polarisation-altering element 70, the dominant electric field components of the source beam are approximately parallel to the y-axis after propagating through said element (referring to the axes labelled in FIG. 12).

In an aspect of the present invention, in a NLFC process using a NLFC component which exhibits walkoff, it is preferable for the beam quality factor of the input beam in the plane of the beam which is parallel to the walkoff plane of the NLFC component to be lower than the beam quality factor of the input beam in the plane of the beam which is parallel to the non-walkoff plane of the NLFC component. This may be represented as $M_x^2<M_y^2$, according to the definitions of $M_x^2$ and $M_y^2$ given above.

For NLFC using a first type of NLFC component it is preferable for the dominant electric field component of the input beam to be in a plane of the input beam which is parallel to the non-walkoff plane of the NLFC component. For NLFC using a second type of NLFC component it is preferable for the dominant electric field component of the input beam to be in a plane of the input beam which is parallel to the walkoff plane of the NLFC component.

One example of the first type of NLFC component is a NLFC component including a β-BaB$_2$O$_4$ crystal with the orientation described in example 1 intended for Type 1 SHG. For the configuration as described in example 1 and shown in FIG. 6, it is preferable for the input beam to have a dominant electric field component in a plane of the input beam which is parallel to the plane containing the y-axis and z-axis.

The beam quality factor of the source beam 32 in the plane of the beam which is parallel to the direction of the dominant electric field component of said beam may be referred to as $M_{parallel}^2$. The beam quality factor of the source beam 32 in the plane of the beam which is perpendicular to the direction of the dominant electric field component of said beam may be referred to as $M_{perpendicular}^2$.

In an aspect of the current invention, if the NLFC component 26 is of the first type of NLFC component defined above, and if the source beam 32 has $M_{parallel}^2<M_{perpendicular}^2$ then a polarisation-altering element 70, which includes a half wave plate which rotates the direction of the dominant electric field components in the source beam by 90° as the source beam propagates through the half wave plate, may be used to provide a resulting input beam 33 with $M_x^2<M_y^2$.

In a further aspect of the current invention, if the NLFC component 26 is of the second type of NLFC component defined above, and if the source beam 32 has $M_{parallel}^2<M_{perpendicular}^2$ then a polarisation-altering element 70, which includes a half wave plate which rotates the direction of the dominant electric field components in the source beam by 90° as the source beam propagates through the half wave plate, may be used to provide a resulting input beam 33 with $M_x^2<M_y^2$.

For this fourth example, for which the schematic diagram is in FIG. 12, a laser diode 21 is oriented so that the dominant electric field component of the divergent beam emitted by the laser diode 21 is approximately parallel to the plane containing the x-axis and z-axis. The source beam 32 has $M_{parallel}^2=2.0$ and $M_{perpendicular}^2=4.0$. In this case $M_{parallel}^2$ is the beam quality factor of the source beam in a plane of said beam which is parallel to the plane containing the x-axis and z-axis. In this case $M_{perpendicular}^2$ is the beam quality factor of the source beam in a plane of said beam which is parallel to the plane containing the y-axis and z-axis. This source beam has $M_{parallel}^2<M_{perpendicular}^2$. The NLFC component 26 is the same as the one described in example 1 and has the same orientation and is of the first type of NLFC component.

The source beam 32 propagates through a polarisation-altering element 70, which includes a half wave plate which rotates the direction of the dominant electric field components in the source beam by 90° as the source beam propagates through the half wave plate. Consequently, after propagating through the polarisation-altering element 70, the dominant electric field component of the source beam is in a plane of said beam which is approximately parallel to the plane containing the y-axis and z-axis. The source beam further has $M_x^2 \approx M_{parallel}^2=2.0$ and $M_y^2 \approx M_{perpendicular}^2=4.0$. This structure thus provides an input beam where the dominant polarisation of the electric field of the input beam is in the preferred orientation for a NLFC component of the first type and also provides an input beam where $M_x^2<M_y^2$.

The suitable convergence half-angle in air of the input beam in the second plane of the beam ($\phi_y$) to achieve high SHG efficiency is determined according to an aspect of the current invention; namely that $\phi_y(M_y^2>2)>\phi_y(M_y^2=1)$. The suitable convergence half-angle in air for a diffraction-limited beam ($M_y^2=1$) may be determined according to the method described by Freegarde et al. For the specific example of a NLFC component including a 7 mm long β-BaB$_2$O$_4$ crystal oriented as described above, with θ≈64.9° and a walkoff angle of the method of Freegarde et al. yields a suitable convergence half-angle in air of the input beam in the second plane of the beam to be $\phi_y(M_y^2=1)\approx0.86°$. Consequently a suitable convergence half-angle in air in the second plane of the input beam with $M_y^2\approx4.0$ is $\phi_y(M_y^2=4.0)>0.86°$.

According to another aspect of the current invention, the suitable convergence half-angle in air of the input beam in the second plane of the beam ($\phi_y$) to achieve high SHG efficiency is $\phi_y(M_y^2)\approx\epsilon\times M_y\times\phi_y(M_y^2=1)$, where $\epsilon$ has a value between a lower value equal to the larger of 0.4 and $$\frac{1}{M_y}$$

and an upper value of 5 and preferably $\epsilon\approx1$. Consequently a suitable convergence half-angle in air in the second plane of the input beam with $M_y^2=4.0$ is between a value of $\phi_y(M_y^2=4.0)=0.86°$ and $\phi_y(M_y^2=4.0)=8.60°$ and preferably is a value of $\phi_y(M_y^2=4.0)\approx1.72°$.

Example 5

A fifth example of the invention is now described. This fifth example is similar to the first example and common features will not be repeated. In the fifth example the light emitting element used to generate the source beam is a type of laser which is not a laser diode. For example, the light emitting element may be a gas laser such as a Argon ion laser, a fibre laser or a solid state laser, including laser diode-pumped solid state laser. In a specific example, the source beam 32 is generated from a host laser crystal doped with praseodymium. More specifically still, the source beam 32 is may be generated from a Pr$^{3+}$ doped LiYF$_4$ crystal, may have a wavelength of approximately 545.9 nm or approximately 522.6 nm, and where the LiYF$_4$ crystal is optically pumped by light with wavelength in air of approximately 444 nm which may be emitted from a laser diode.

Example 6

A sixth example of the invention is now described. This sixth example is similar to the first example and common features will not be repeated. In the sixth example the light emitting element used to generate the source input beam 32 is a frequency-converted laser. In a specific example, the source input beam is generated by frequency-doubling the light with wavelength approximately equal to 1064 nm emitted from a Nd:YAG laser crystal and the frequency-doubled output has an emission wavelength of approximately 532 nm.

Although the invention has been shown and described with respect to a certain embodiment or embodiments, equivalent alterations and modifications may occur to others skilled in the art upon the reading and understanding of this specification and the annexed drawings. In addition, while a particular feature of the invention may have been described above with respect to only one or more of several embodiments, such feature may be combined with one or more other features of the other embodiments, as may be desired and advantageous for any given or particular application.

In accordance with the above, an aspect of the invention is a nonlinear frequency conversion (NLFC) device. In exemplary embodiments, the NLFC device includes an NLFC component that exhibits walkoff, and an optical component configured to converge a non-diffraction limited input beam into the NLFC component. At least a portion of an output beam outputted by the NLFC component has a different frequency from a frequency of the input beam.

In an exemplary embodiment of the NLFC device, a beam quality factor in at least one plane of the input beam is greater than 2 ($M^2>2$).

In an exemplary embodiment of the NLFC device, the beam quality factor in a plane parallel to a non-walkoff plane of the NLFC component is greater than 2 ($M_y^2>2$).

In an exemplary embodiment of the NLFC device, a beam quality factor of the input beam in a plane parallel to a walkoff plane of the NLFC component is lower than a beam quality factor of the input beam in a plane parallel to a non-walkoff plane of the NLFC component ($M_x^2<M_y^2$).

In an exemplary embodiment of the NLFC device, the device further includes a polarization altering element that alters an orientation of polarization of the input beam such that $M_x^2<M_y^2$.

In an exemplary embodiment of the NLFC device, a convergence half-angle in air in a non-walkoff plane of the NLFC component is larger than a convergence half-angle angle for diffraction-limited light, where a beam quality factor $M^2$ of the diffraction-limited light equals 1.

In an exemplary embodiment of the NLFC device, the convergence half-angle in air in the non-walkoff plane of the NLFC component is $M_y$ multiplied by the convergence half-angle for diffraction-limited light, where $M_y$ is the square root of the beam quality factor for the non-diffraction limited light in the non-walkoff plane.

In an exemplary embodiment of the NLFC device, the convergence half-angle in air in the non-walkoff plane of the NLFC component is a multiple, $\epsilon\times M_y$, multiplied by the convergence half-angle value for diffraction-limited light, wherein ϵ has a value between a lower value equal to the larger of 0.4 and $$\frac{1}{M_y}$$

and an upper value of 5, and $M_y$ is the square root of the beam quality factor of the input beam in the non-walkoff plane.

In an exemplary embodiment of the NLFC device, $0.6<\epsilon<5.0$.

In an exemplary embodiment of the NLFC device, the frequency of the output light of the NLFC component is twice the frequency of the input light.

Another aspect of the invention is a light source. In exemplary embodiments, the light source includes a light emitting element that emits a non-diffraction limited input light beam, an nonlinear frequency conversion (NLFC) component that exhibits walkoff and performs second harmonic generation whereby at least a portion of an output beam outputted by the NLFC component has twice a frequency of the input beam, and an optical component configured to converge the non-diffraction limited input beam into the NLFC component.

In an exemplary embodiment of the light source, a wavelength of the input beam is 400-600 nm and a wavelength of the output beam is 200-300 nm.

In an exemplary embodiment of the light source, a beam quality factor in a plane parallel to a non-walkoff plane of the NLFC component is greater than 3 ($M_y^2>3$).

In an exemplary embodiment of the light source, a convergence half-angle in air in a non-walkoff plane of the NLFC component is larger than a convergence half-angle angle for diffraction-limited light, where a beam quality factor $M^2$ of the diffraction-limited light equals 1.

In an exemplary embodiment of the light source, the convergence half-angle in air in the non-walkoff plane of the NLFC component is a multiple, ϵ×M, multiplied by a convergence half angle value for diffraction-limited light, wherein ϵ has a value between a lower value equal to the larger of 0.4 and $$\frac{1}{M_y}$$

and an upper value of 5, and $M_y$ is the square root of the beam quality factor of the input beam in the non-walkoff plane.

In an exemplary embodiment of the light source, the optical component is configured to converge the input beam with a convergence half-angle between 0.9° and 10.5°.

In an exemplary embodiment of the light source, ϵ=1.0 and the optical component is configured to converge the input beam with a convergence half-angle of 2.1±1°.

In an exemplary embodiment of the light source, the light emitting element is a laser diode including $Al_yIn_xGa_{1-x-y}N$ semiconductor materials, and one dimension of an emission region of the laser diode is at least 5 μm.

In an exemplary embodiment of the light source, the NLFC component includes a β-$BaB_2O_4$ crystal.

In an exemplary embodiment of the light source, a convergence half-angle is determined such that a beam waist radii of the input beam, after propagation through an input surface of the NLFC component which is not planar or does not have a surface normal parallel to the propagation direction of the input beam, is approximately equal to a beam waist radii of the input beam which would form in the NLFC component after propagation of an input beam with a convergence half-angle in air into an input surface of the NLFC component that is a planar surface and the direction normal to said surface is parallel to the propagation direction of the input beam.

INDUSTRIAL APPLICABILITY

Frequency-converted lasers in accordance with the present invention may be used as the light source in fluorescence sensors or absorption sensors.

The invention claimed is:

1. A light source comprising:
  a light emitting element that is configured to emit a non-diffraction limited input light beam;
  a nonlinear frequency conversion (NLFC) component that exhibits walkoff and performs second harmonic generation whereby at least a portion of an output beam outputted by the NLFC component has twice a frequency of the non-diffraction limited input light beam; and
  an optical component positioned to receive the non-diffraction limited input light beam and configured to converge the non-diffraction limited input light beam into the NLFC component;
  wherein the light emitting element is configured to emit the non-diffraction limited input light beam having a beam quality factor in at least one plane of the input beam that is greater than 2 ($M^2>2$); and
  wherein the light emitting element is a laser diode including $Al_yIn_xGa_{1-x-y}N$ (0≤x≤1, 0≤y≤1) semiconductor materials, and one dimension of an emission region of the laser diode is at least 5 μm.

2. The light source of claim 1, wherein a wavelength of the non-diffraction limited input light beam is 400-600 nm and a wavelength of the output beam is 200-300 nm.

3. The light source of claim 1, wherein the light emitting element is configured to emit the non-diffraction limited input light beam having a beam quality factor in a plane parallel to a non-walkoff plane of the NLFC component that is greater than 3 ($M_y^2>3$).

4. The light source of claim 1, wherein the light emitting element is configured to emit the non-diffraction limited input light beam having a beam quality factor in a plane parallel to a non-walkoff plane of the NLFC component that is greater than 2 ($M_y^2>2$).

5. The light source of claim 1, wherein the optical component is configured to converge the non-diffraction limited input light beam with a convergence half-angle between 0.9° and 10.5°.

6. The light source of claim 5, wherein the optical component is configured to converge the non-diffraction limited input light beam to have a convergence half-angle characterized in that a beam waist radii of the non-diffraction limited input light beam, after propagation through an input surface of the NLFC component which is not planar or does not have a surface normal parallel to the propagation direction of the non-diffraction limited input light beam, are approximately equal to a beam waist radii of the non-diffraction limited input light beam which would form in the NLFC component after propagation of a non-diffraction limited input light beam with a convergence half-angle in air into an input surface of the NLFC component that is a planar surface and the direction normal to said surface is parallel to the propagation direction of the non-diffraction limited input light beam.

7. The light source of claim 1, wherein $\epsilon=1.0$ and the optical component is configured to converge the non-diffraction limited input light beam with a convergence half-angle of $2.1\pm1°$.

8. The light source of claim 1, wherein the NLFC component includes a $\beta\text{-BaB}_2\text{O}_4$ crystal.

9. The NLFC device of claim 1, wherein the light emitting element is configured to emit the non-diffraction limited input light beam having a beam quality factor in at least one plane of the non-diffraction limited input light beam that is greater than 3 ($M^2>3$).

10. The light source of claim 1, wherein:
   the NLFC component includes a $\beta\text{-BaB}_2\text{O}_4$ crystal;
   the optical component is configured to converge the non-diffraction limited input light beam with a convergence half-angle in air in the non-walkoff place of the NLFC component between $0.9°$ and $10.5°$;
   the light emitting element is configured to emit the non-diffraction limited input light beam having a beam quality factor in a plane parallel to a non-walkoff plane of the NLFC component that is greater than 3 ($M_y^2>3$); and
   a wavelength of the non-diffraction limited input light beam is 400-600 nm and a wavelength of the output beam is 200-300 nm.

11. The light source of claim 10, wherein the output beam has an output power of greater than 0.002 mW and a wavelength between 210 nm and 230 nm.

* * * * *